United States Patent
Park et al.

(10) Patent No.: US 8,592,310 B2
(45) Date of Patent: Nov. 26, 2013

(54) METHODS OF MANUFACTURING A SEMICONDUCTOR DEVICE

(75) Inventors: Byung-Lyul Park, Seoul (KR); Gil-Heyun Choi, Seoul (KR); Suk-Chul Bang, Yongin-si (KR); Kwang-Jin Moon, Suwon-si (KR); Dong-Chan Lim, Suwon-si (KR); Deok-Young Jung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 193 days.

(21) Appl. No.: 13/240,040

(22) Filed: Sep. 22, 2011

(65) Prior Publication Data

US 2012/0142185 A1 Jun. 7, 2012

(30) Foreign Application Priority Data

Dec. 3, 2010 (KR) .................. 10-2010-0122577

(51) Int. Cl.
*H01L 21/44* (2006.01)

(52) U.S. Cl.
USPC ........... 438/667; 438/637; 257/621; 257/773; 257/724; 257/E23.011; 257/E23.024

(58) Field of Classification Search
USPC .................. 438/637, 667; 257/621, 773, 724, 257/E23.011, E23.024
See application file for complete search history.

(56) References Cited

U.S. PATENT DOCUMENTS

| | | | |
|---|---|---|---|
| 7,365,440 B2 | 4/2008 | Dotta | |
| 7,416,963 B2 | 8/2008 | Umemoto et al. | |
| 8,114,772 B2 * | 2/2012 | Lee et al. | 438/667 |
| 2006/0033168 A1 | 2/2006 | Umemoto et al. | |
| 2006/0071347 A1 | 4/2006 | Dotta | |
| 2011/0097891 A1 * | 4/2011 | Lee et al. | 438/612 |

FOREIGN PATENT DOCUMENTS

JP 2004-342861 A 12/2004

* cited by examiner

*Primary Examiner* — Telly Green
(74) *Attorney, Agent, or Firm* — Harness, Dickey & Pierce, P.L.C.

(57) ABSTRACT

In methods of manufacturing a semiconductor device, a substrate having a first surface and a second surface opposite to the first surface is prepared. A sacrificial layer pattern is formed in a region of the substrate that a through electrode will be formed. The sacrificial layer pattern extends from the first surface of the substrate in a thickness direction of the substrate. An upper wiring layer is formed on the first surface of the substrate. The upper wiring layer includes a wiring on the sacrificial layer pattern. The second surface of the substrate is partially removed to expose the sacrificial layer pattern. The sacrificial layer pattern is removed from the second surface of the substrate to form an opening that exposes the wiring. A through electrode is formed in the opening to be electrically connected to the wiring.

20 Claims, 22 Drawing Sheets

METHODS OF MANUFACTURING A SEMICONDUCTOR DEVICE

PRIORITY STATEMENT

This application claims priority under 35 U.S.C. §119(e) to Korean Patent Application No. 2010-0122577, filed on Dec. 3, 2010 in the Korean Intellectual Property Office (KIPO), the entire contents of which are herein incorporated by reference.

BACKGROUND

1. Field

Example embodiments relate to methods of manufacturing a semiconductor device. More particularly, example embodiments relate to methods of manufacturing a semiconductor device having a through electrode in a semiconductor substrate.

2. Description of the Related Art

As device speeds and device integration increase, signal delays may also be increased, for example, due to parasitic capacitance introduced by interconnection structures. Advances in integration technology have led to the development of three-dimensional integration, where wafers may be stacked three-dimensionally, in contrast to the conventional two-dimensional approach.

In a three-dimensional wafer stack package (WSP), a technique called through-silicon via (TSV) can be used to extend the via hole through a substrate so that a conductive via for a through electrode may be formed to vertically extend and completely penetrate through the substrate. Such a TSV structure may provide higher speeds, higher integration, and improved functionality in comparison to a long wire pattern interconnection. For example, the conductive via may be formed using copper (Cu) having a low resistance. However, copper is known to have high diffusivity in silicon.

Conventionally, the TSV may be formed through the substrate, prior to back end processing. In particular, the TSV structure may be formed by forming an opening or hole in a substrate (e.g., a silicon substrate). An insulation layer may be formed on the substrate and in the opening. A conductive metal layer (e.g., a copper layer (Cu)) may be formed in the opening, for example, by a plating process or deposition process. A backside of the substrate may then be recessed to expose at least a portion of the conductive metal layer, thereby forming a conductive via extending through the substrate. In this case, the substrate including the conductive via may be exposed repeatedly during processes (e.g., an etch process). Especially, when the portion of the conductive metal layer is exposed during an etch process, the metal of the conductive metal layer (e.g., copper) may diffuse into the substrate to thereby deteriorate a semiconductor device such as a semiconductor chip. Further, a thermal stress may occur due to a thermal expansion difference between the metal and the substrate. Thus, it may be difficult to form the opening having a desired aspect ratio in the substrate. Further, when forming the opening in the substrate, a misalignment problem of the through electrode between an upper wiring may occur.

SUMMARY

Example embodiments relate to methods of manufacturing a semiconductor device. More particularly, example embodiments relate to methods of manufacturing a semiconductor device having a through electrode in a semiconductor substrate.

Example embodiments provide a semiconductor device having a through electrode with a desired aspect ratio.

Example embodiments provide a semiconductor package including the semiconductor device.

Example embodiments provide methods of manufacturing the semiconductor device.

According to example embodiments, in a method of manufacturing a semiconductor device, a substrate having a first surface and a second surface opposite to the first surface is prepared. A sacrificial layer pattern is formed in a region, which a through electrode will be formed, in the substrate. The sacrificial layer pattern extends from the first surface of the substrate in a thickness direction of the substrate. An upper wiring layer is formed on the first surface of the substrate. The upper wiring layer includes a wiring on the sacrificial layer pattern. The second surface of the substrate is partially removed to expose the sacrificial layer pattern. The sacrificial layer pattern is removed from the second surface of the substrate to form a first opening that exposes the wiring. A through electrode is formed in the first opening to be electrically connected to the wiring.

In example embodiments, forming the sacrificial layer pattern may include forming a second opening in the substrate, the second opening extending from the first surface in a thickness direction of the substrate, forming a first insulation layer on sidewalls and a bottom surface of the second opening, forming a sacrificial layer on the first insulation layer, and partially removing the sacrificial layer to form the sacrificial layer pattern that partially fills the second opening.

In example embodiments, the sacrificial layer may be formed using an insulating material having an etch selectivity with respect to the first insulation layer.

In example embodiments the sacrificial layer may have an etch rate at least three times greater than that of the first insulation layer.

In example embodiments, the etch selectivity of the sacrificial layer and the first insulation layer may range from about 3:1 to about 20:1.

In example embodiments, forming the sacrificial layer pattern may include partially removing the sacrificial layer by a chemical mechanical polishing process or an etch process.

In example embodiments, the sacrificial layer pattern may be removed from the substrate by a dry etch process or a wet etch process.

In example embodiments, the sacrificial layer pattern may be formed to have a void therein.

In example embodiments, the method may further include forming a spacer on sidewalls of the first opening after forming the first opening that exposes the wiring.

In example embodiments, the method may further include forming a capping layer on the sacrificial layer pattern.

In example embodiments, forming the first opening that exposes the wiring may include partially removing the capping layer when the sacrificial layer pattern is removed from the substrate (i.e., simultaneously).

In example embodiments, the through electrode may be formed to completely fill the first opening.

In example embodiments, the through electrode may be formed conformally along the profile of the first opening to partially fill the opening.

In example embodiments, the through electrode may include a recess in an upper portion thereof.

In example embodiments, at least one circuit pattern may be formed on the first surface of the substrate and the wiring may be electrically connected to the at least one circuit pattern.

In example embodiments, partially removing the second surface of the substrate to expose the sacrificial layer pattern may include partially removing the second surface of the substrate to expose a portion of the sacrificial layer pattern, forming a second insulation layer on the second surface of the substrate to cover the exposed sacrificial layer pattern, and partially removing the second insulation layer to form a second insulation layer pattern that exposes a lower portion of the sacrificial layer pattern.

In example embodiments, the second surface of the substrate may be removed by a chemical mechanical polishing process or an etch process.

In example embodiments, the second insulation layer may be formed using an insulating material having an etch selectivity with respect to the sacrificial layer pattern.

In example embodiments, the sacrificial layer pattern may have an etch rate at least three times greater than that of the second insulation layer.

In example embodiments, the through electrode may be electrically connected to another semiconductor device via a connection member. According to example embodiments, a method of manufacturing a semiconductor device includes providing a substrate having a first recess. A sacrificial layer pattern is formed on a first surface of the substrate. The sacrificial layer pattern fills in the first recess. An upper wiring layer may be formed on the first surface of the substrate. The sacrificial layer pattern is exposed by partially removing a second surface of the substrate. The second surface opposes the first surface of the substrate. The upper wiring layer is exposed by removing the exposed sacrificial layer pattern from the first recess, and a through electrode is formed connected to the exposed upper wiring layer. The through electrode is electrically connected to a wiring in the exposed upper wiring layer.

In example embodiments, an insulation layer may be formed conformally on sidewalls of the first recess, after exposing the wiring. The insulation layer may be etched to form a spacer on the sidewalls of the first recess. A seed layer may be formed on the spacer. The through electrode may be formed on the seed layer.

In example embodiments, forming the sacrificial layer pattern on the first surface of the substrate includes partially filling the first recess with an insulating material used to form the sacrificial layer pattern.

In example embodiments, the sacrificial layer pattern may have a void.

In example embodiments, a capping layer may be formed on the sacrificial layer pattern, prior to forming the upper wiring layer. The capping layer may be partially removed when exposing the upper wiring layer.

In example embodiments, an insulation layer may be conformally formed on sidewalls of the first recess and the capping layer, after exposing the upper wiring layer. The insulation layer may be etched to form a spacer on the sidewalls of the first recess. A seed layer may be formed on the spacer. The through electrode may be formed on the seed layer.

In example embodiments, a second recess may be formed in the through electrode.

According to example embodiments, in a method of manufacturing a semiconductor device in accordance with example embodiments, a sacrificial layer pattern may be formed in a region for a through electrode to be formed to extend from a first surface of a substrate in a thickness direction of the substrate. A wiring process (BEOL) process may be performed to form an upper wiring layer on the first surface including wirings that are electrically connected the through electrode. Then, after the sacrificial layer pattern is removed from a second surface of the substrate to form an opening, the through electrode may be formed in the opening to be electrically connected to the wiring.

Accordingly, because the through electrode is formed in a region where the sacrificial layer pattern is removed from the substrate, a misalignment problem of the through electrode between the first upper wiring of the upper wiring layer may not occur. Additionally, because the through electrode is formed after performing the wiring process (BEOL process), a thermal stress to the through electrode under a high temperature of the BEOL process may be avoided. Further, because the through electrode is formed after performing a planarization process for a backside of the substrate, a conductive material of the through electrode such as copper may be prevented from diffusing into the substrate during the manufacturing processes.

BRIEF DESCRIPTION OF THE DRAWINGS

Example embodiments will be more clearly understood from the following detailed description taken in conjunction with the accompanying drawings.

FIGS. 1 to 14 are cross-sectional views illustrating a method of manufacturing a semiconductor device in accordance with example embodiments.

FIGS. 15 to 17 are cross-sectional views illustrating a method of manufacturing a semiconductor device in accordance with example embodiments.

FIGS. 18 and 19 are cross-sectional views illustrating a method of manufacturing a semiconductor device in accordance with example embodiments.

FIGS. 20 to 23 are cross-sectional views illustrating a method of manufacturing a semiconductor device in accordance with example embodiments.

FIGS. 24 and 25 are cross-sectional views illustrating a method of manufacturing a semiconductor device in accordance with example embodiments.

FIG. 26 is a cross-sectional view illustrating a method of manufacturing a semiconductor device in accordance with example embodiments.

FIG. 27 illustrates other example embodiments.
FIG. 28 illustrates yet other example embodiments.
FIG. 29 illustrates further example embodiments.

DETAILED DESCRIPTION OF EXAMPLE EMBODIMENTS

Figure 1:
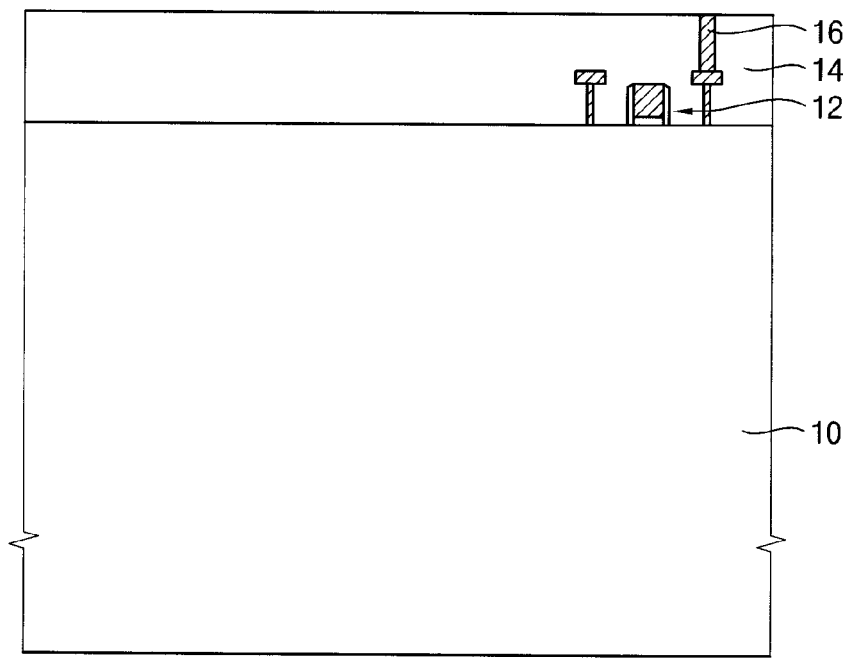
FIGS. 1 to 29 represent non-limiting, example embodiments as described herein.

Various example embodiments will be described more fully hereinafter with reference to the accompanying drawings, in which example embodiments are shown. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Example embodiments relate to methods of manufacturing a semiconductor device. More particularly, example embodiments relate to methods of manufacturing a semiconductor device having a through electrode in a semiconductor substrate.

FIGS. 1 to 14 are cross-sectional views illustrating a method of manufacturing a semiconductor device in accordance with example embodiments.

Referring to FIG. 1, a substrate 10 having a circuit pattern 12 formed thereon may be prepared. The substrate 10 may have a first surface (e.g., an upper surface) and a second surface (e.g., a bottom surface) opposite to the first surface. For example, the substrate 10 may be a single-crystalline silicon substrate.

The circuit patterns 12 may be formed on the first surface of the substrate 10. An insulation interlayer 14 may be formed on the first surface of the substrate 10 to cover the circuit patterns 12. An etch stop layer (not illustrated) may be formed on the insulation interlayer 14.

For example, the circuit pattern 12 may include a transistor, a diode, a capacitor, etc. The circuit patterns 12 may constitute circuit elements. Accordingly, the semiconductor device may be a semiconductor chip including a plurality of the circuit elements formed therein.

The circuit element may include a plurality of memory devices. Examples of the memory devices may be a volatile memory device and a non-volatile memory device. Examples of the volatile memory device may be DRAM, SRAM, etc. Examples of the non-volatile memory device may be EPROM, EEPROM, Flash EEPROM, etc.

Accordingly, a wafer process (FEOL (front-end-of-line) process) may be performed to form the circuit patterns 12 on the substrate 10.

Figure 2:
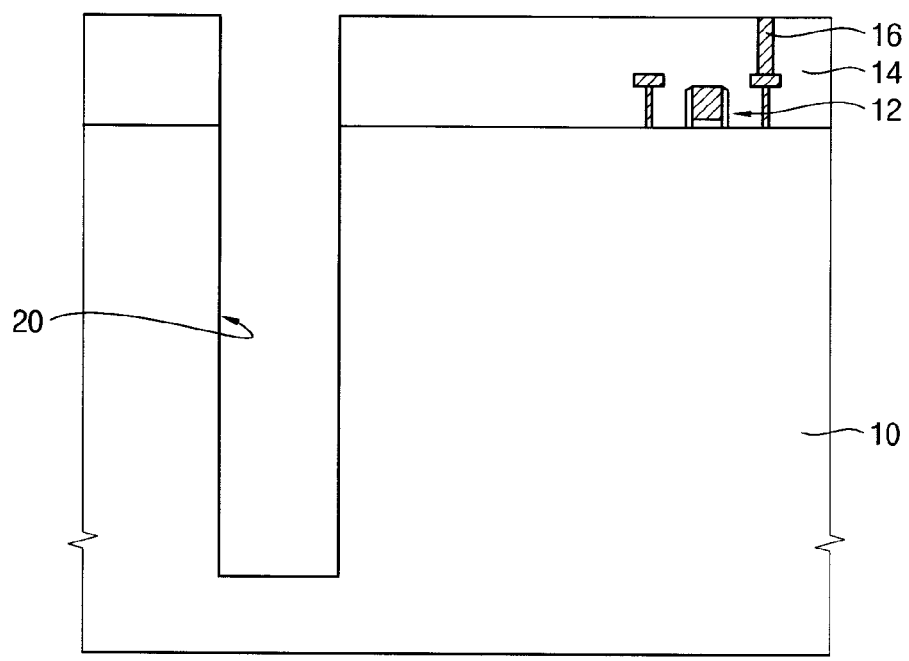

Referring to FIG. 2, a first opening 20 may be formed in the substrate 10 to extend in a thickness direction from the first surface of the substrate 10.

Formation of the first opening 20 includes forming a photoresist layer (not illustrated) on the insulation interlayer 14 on the substrate 10, and then pattering the photoresist layer to form a photoresist pattern (not illustrated) that exposes a region for a through electrode to be formed.

The etch stop layer, the insulation interlayer and the substrate 10 may be partially etched using the photoresist pattern as an etching mask to form the first opening 20. For example, the first opening 20 may be formed by a dry etch process or a wet etch process. The depth of the first opening may be determined in consideration of the length of a through electrode, the thickness of a stack package, etc. Then, the photoresist pattern may be removed from the substrate 10.

Figure 3:
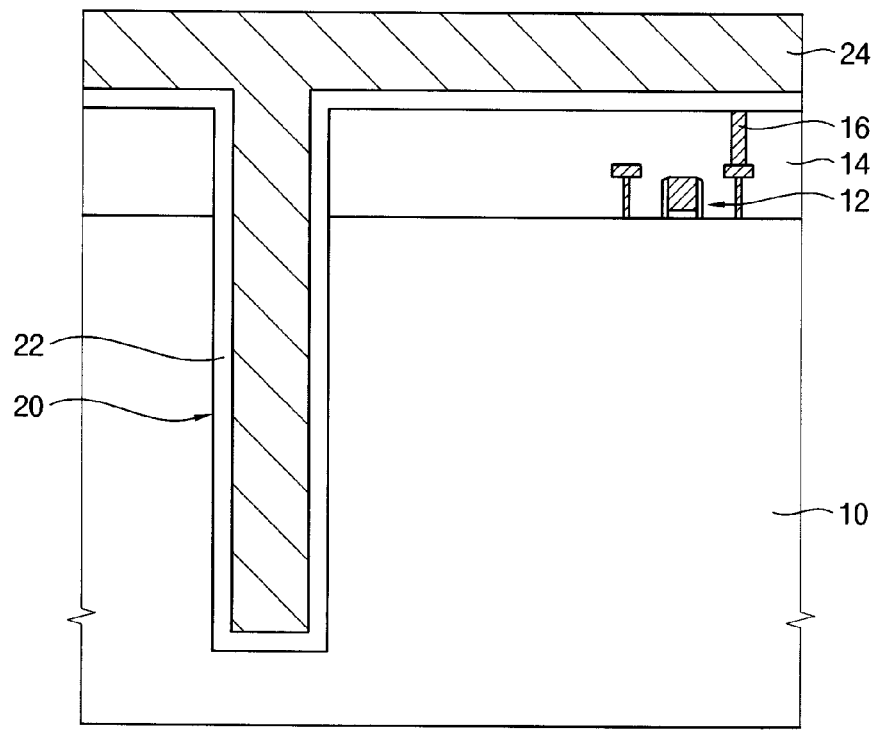
Figure 4:
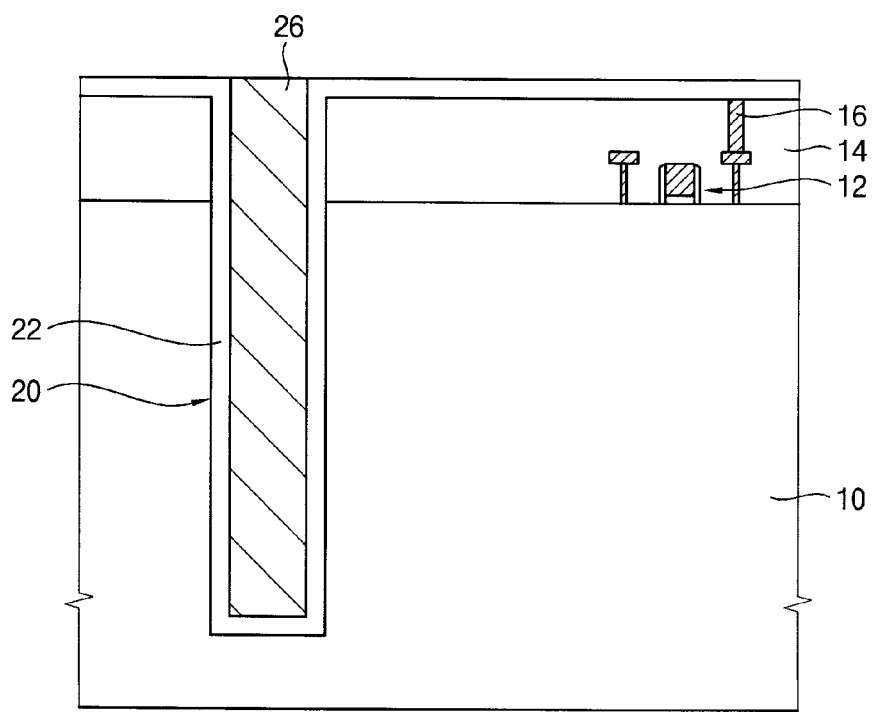

Referring to FIGS. 3 and 4, a sacrificial layer pattern 26 may be formed to fill the first opening 20. In example embodiments, a first insulation layer 22 and a sacrificial layer 24 may be sequentially formed in the first opening 20.

In particular, the first insulation layer 22 may be formed conformally on sidewalls and a bottom surface of the first opening 20 and an upper surface of the insulation interlayer 14. The first insulation layer 22 may insulate the substrate 10 from a conductive material within the first opening 20.

The first insulation layer may include silicon oxide or carbon doped silicon oxide. For example, the first insulation layer may be formed by a plasma oxidation process or a chemical vapor deposition process. The first insulation layer may be formed using a TEOS layer, an ozone TEOS layer, a USG layer, etc.

Then, the sacrificial layer 24 may be formed on the first insulation layer 22 to completely fill the first opening 20. The sacrificial layer 24 may be formed using an insulating material having an etch selectivity with respect to the first insulation layer 22. For example, the sacrificial layer 24 may be formed using a SOD (spin-on dielectric) material. The sacrificial layer 24 may have an etch rate at least three times greater than that of the first insulation layer 22. For example, under the same wet etch conditions, the etch selectivity of the sacrificial layer 24 and the first insulation layer 22 may range from about 3:1 to about 20:1.

Then, an upper portion of the sacrificial layer 24 may be removed to form the sacrificial layer pattern 26 in the first opening 20. For example, the sacrificial layer 24 may be removed by a chemical mechanical polishing process, an etch process, etc. As illustrated in FIG. 4, a portion of the sacrificial layer 24 may be removed to from the sacrificial layer pattern 26. Alternatively, the sacrificial layer 24 and the first insulation layer 22 on the insulation interlayer 16 may be partially or entirely removed to form the sacrificial layer pattern.

Figure 5:
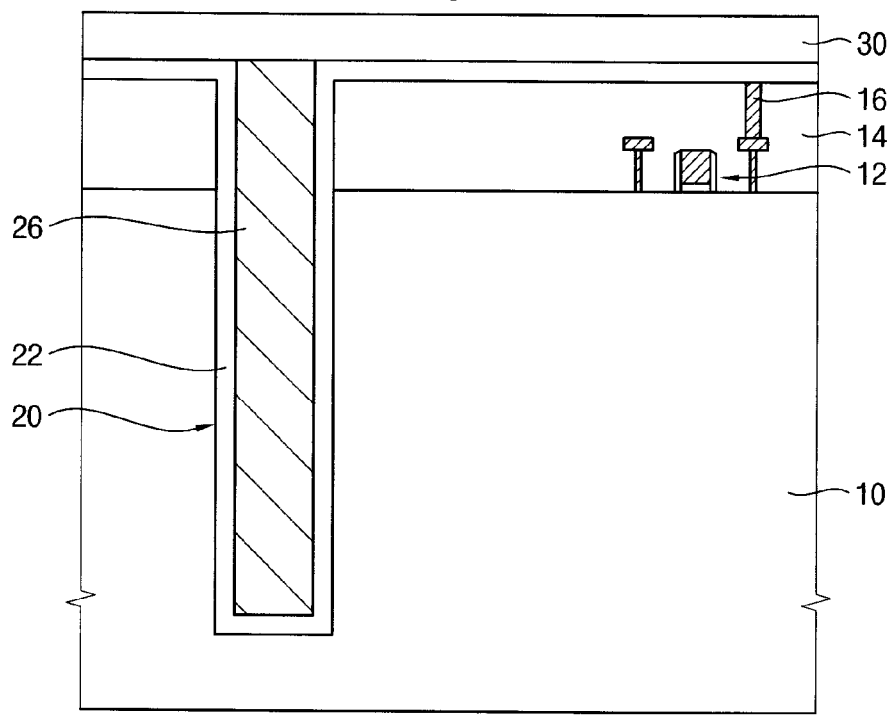
Figure 6:
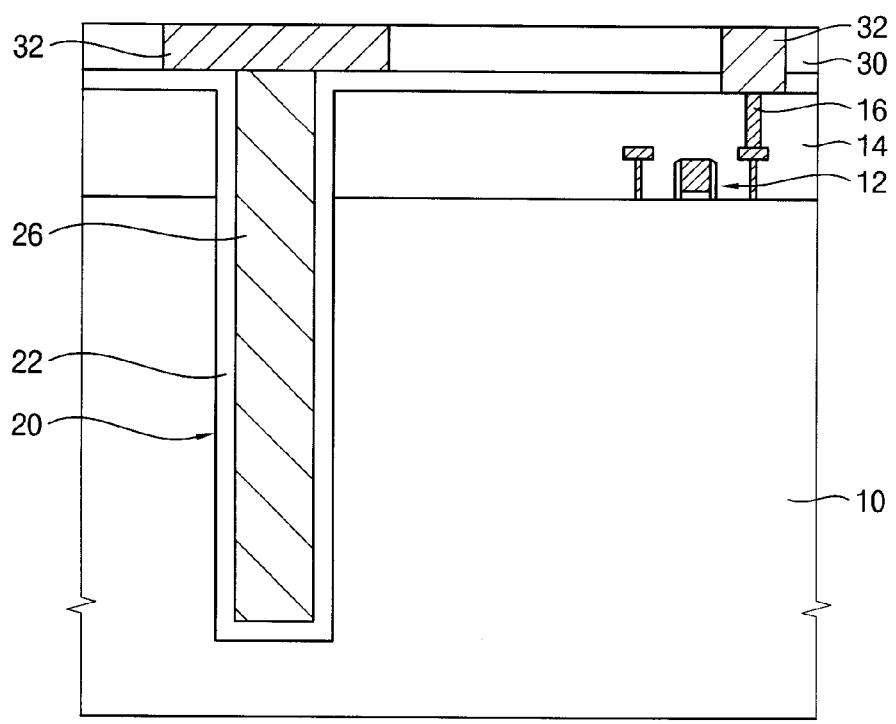
Figure 7:
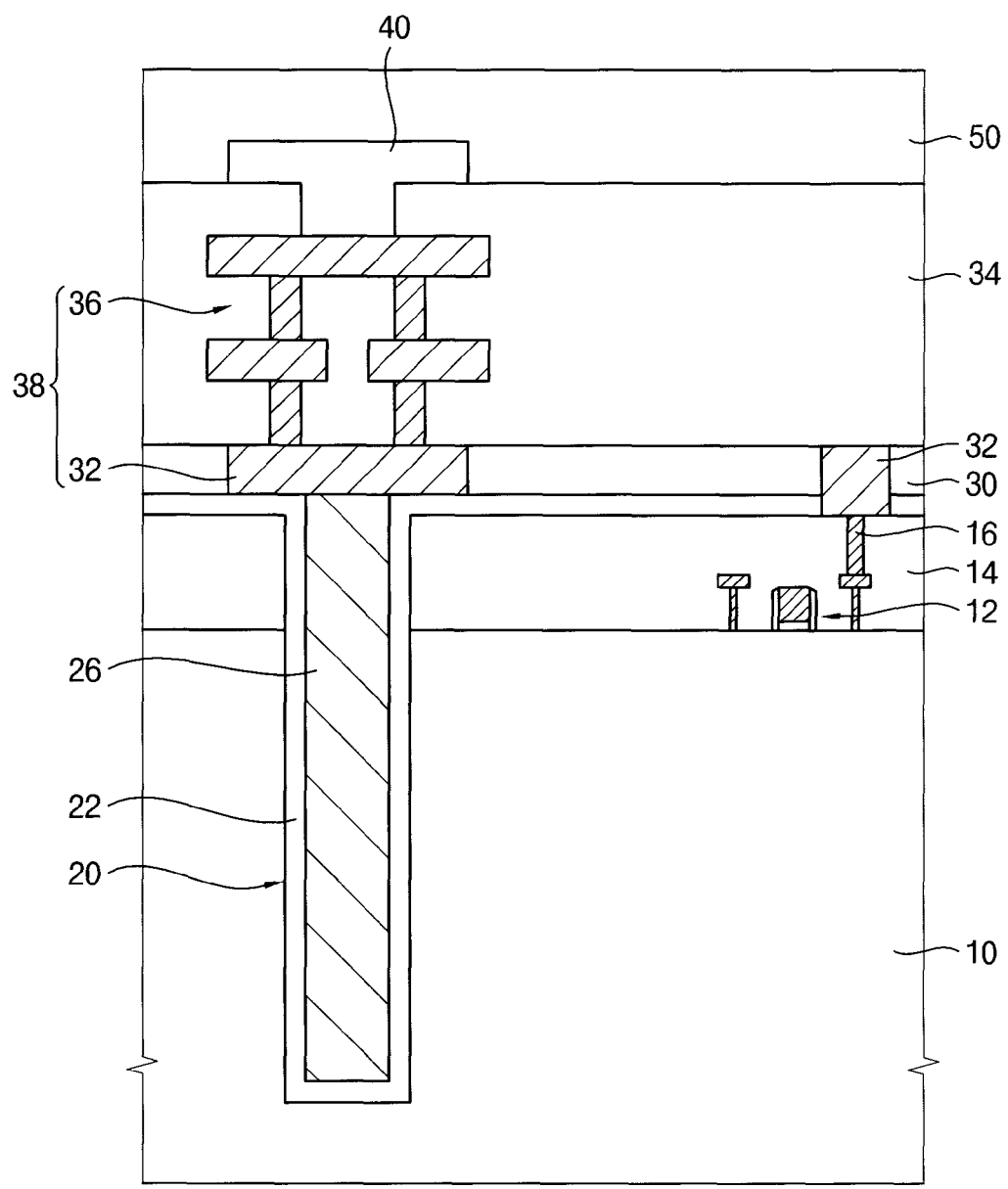

Referring to FIGS. 5 to 7, an upper wiring layer 38 may be formed on the first surface of the substrate 10. A wiring process (BEOL (back-end-of-line) process) may be performed to form the upper wiring layer on the first surface of the substrate 10.

The upper wiring layer 38 may include upper wirings 32 and 36. The upper wirings may be electrically connected to the circuit pattern 12 and the through electrode.

In particular, a first inter-metal dielectric layer 30 may be formed on the insulation interlayer 14. The first inter-metal dielectric layer 30 and the first insulation layer 22 may be partially etched to form openings that expose upper surfaces of a lower wiring 16 and the sacrificial layer pattern 26. The openings may be filled with a conductive material to form first upper wirings 32. Accordingly, the first upper wirings 32 may be formed on the sacrificial layer pattern 26 and the lower wiring 16, respectively.

A second inter-metal dielectric layer 34 may be formed on the first inter-metal dielectric layer 30, and then, a second upper wiring 36 may be formed in the second inter-metal dielectric layer 34. The second upper wiring 36 may be electrically connected to the first upper wiring 32.

The second inter-metal dielectric layer 34 may be partially removed from an opening that exposes the uppermost second upper wiring 36. A connection pad 40 may be formed in the opening to make contact with the uppermost second upper wiring 36.

Alternatively, the uppermost second upper wiring 36 may be used as a connection pad. In this case, the second inter-metal dielectric layer 34 may further include a protection layer (not illustrated) that exposes the uppermost second upper wiring 36. For example, the protection layer may include polyimide. The uppermost second upper wiring 36 (e.g., a connection pad) may be exposed by the protection layer. A connection member (e.g., a bump) may be disposed on the uppermost second upper wiring 36 to be electrically connected to another semiconductor device.

Then, in order to form a through electrode from the second surface of the substrate 10, a handling substrate 50 may be adhered to the second inter-metal dielectric layer 34. The handling substrate 50 may be removed from the substrate 10 after forming the through electrode.

Figure 8:
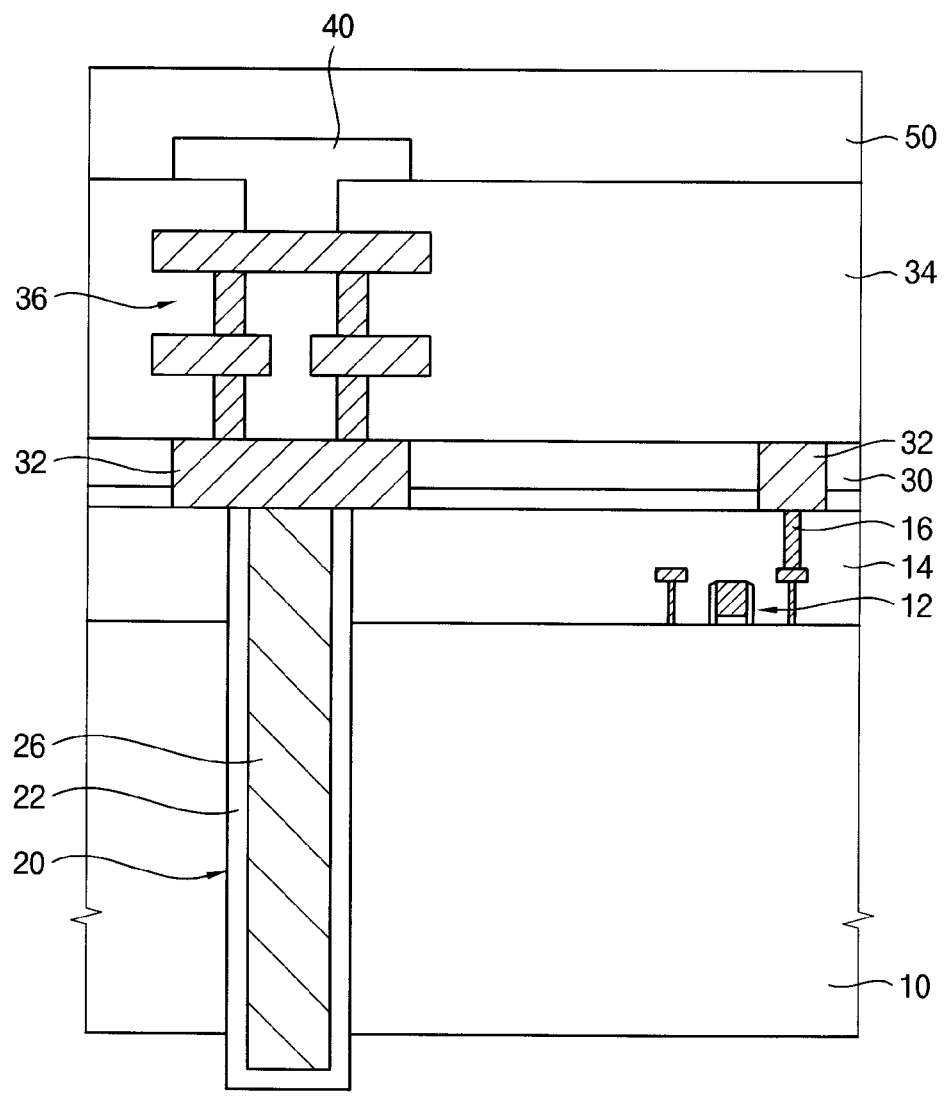
Figure 9:
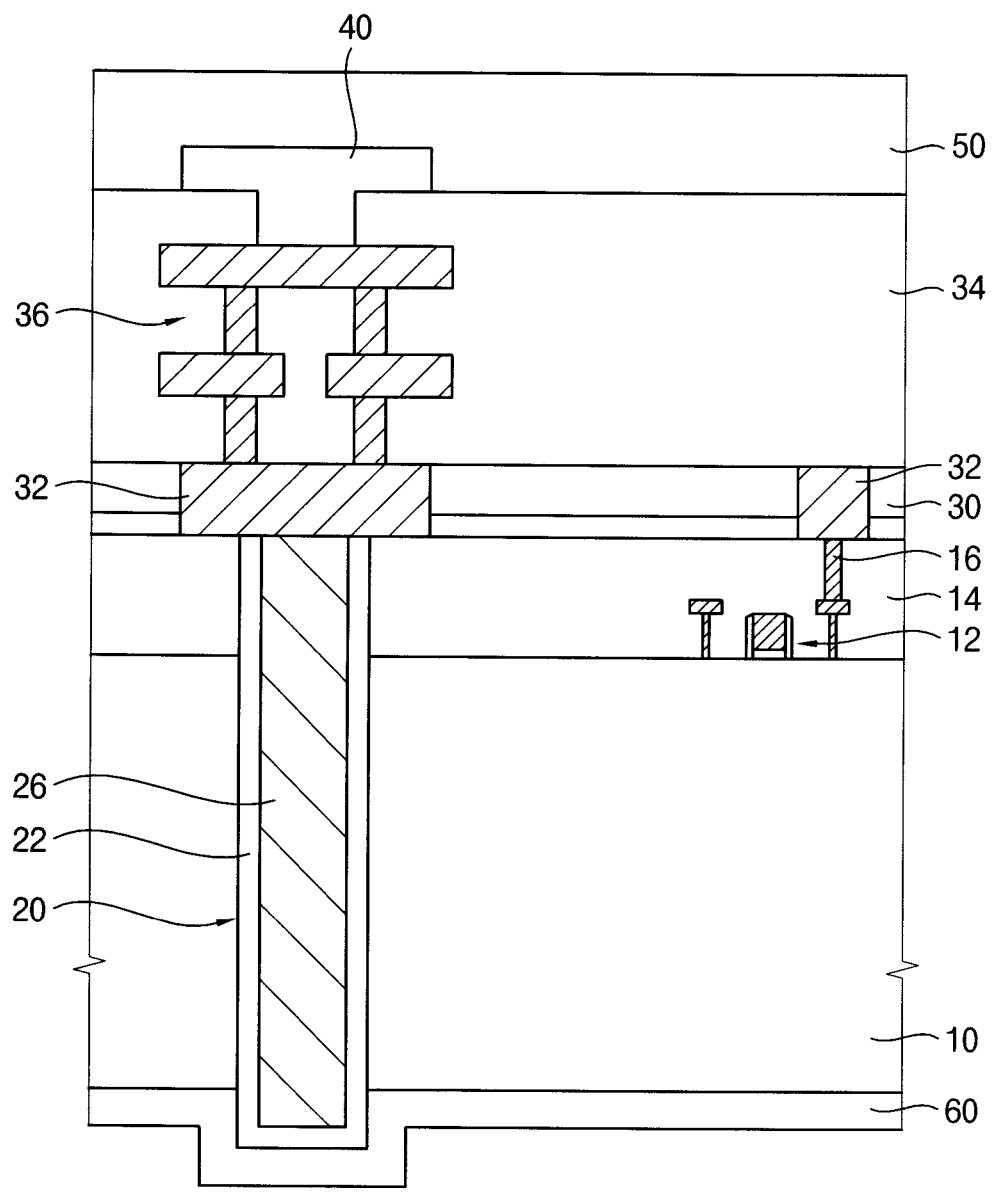
Figure 10:
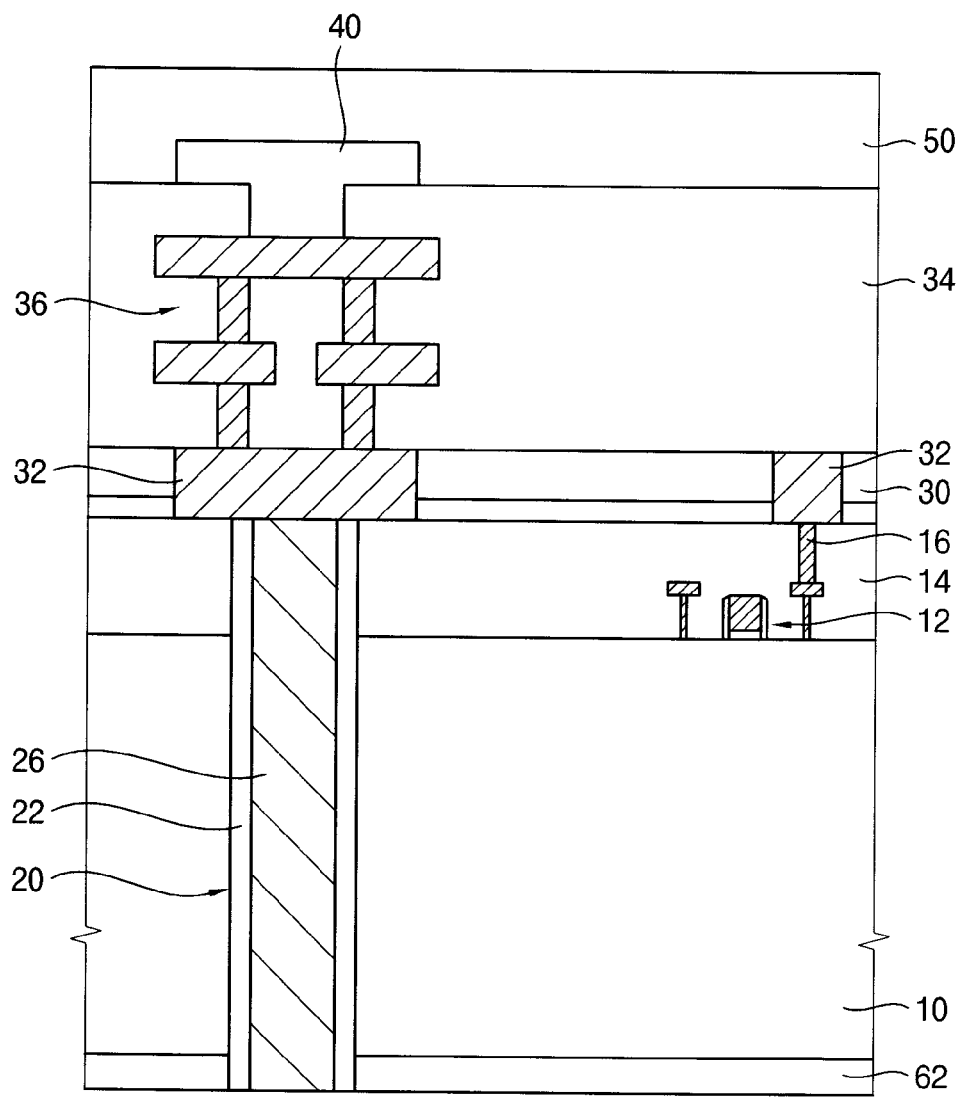

Referring to FIGS. 8 to 10, the second surface (e.g., the bottom surface) of the substrate 10 may be partially removed until the sacrificial layer pattern 26 is exposed from the substrate 10.

First, the second surface of the substrate 10 may be partially removed to expose portions of the sacrificial layer pattern 26 and the first insulation layer 22 on the sacrificial layer pattern 26. For example, the second surface of the substrate 10 may be removed by a chemical mechanical polishing process, an etch process, etc. The second surface of the substrate 10 may be partially removed to control the thickness of the substrate 10.

Then, a second insulation layer 60 may be formed on the second surface of the partially removed substrate 10 to cover the exposed sacrificial layer pattern 26 and the first insulation layer 22. The second insulation layer 60 may be formed using an insulating material having an etch selectivity with respect to the sacrificial layer pattern 26. For example, the sacrificial layer pattern 26 may have an etch rate at least three times greater than that of the second insulation layer 60. The insulating material of the second insulation layer 60 may be substantially the same as that of the first insulation layer 22. The second insulation layer 60 may have an etch rate identical to that of the first insulation layer 22.

Then, the second insulation layer 60 and the first insulation layer 22 on the sacrificial layer pattern 16 may be partially removed to form a second insulation layer pattern 62 that exposes the sacrificial layer pattern 22. For example, the second insulation layer 60 and the first insulation layer 22 may be partially remove by a chemical mechanical polishing process or an etch process.

Figure 11:
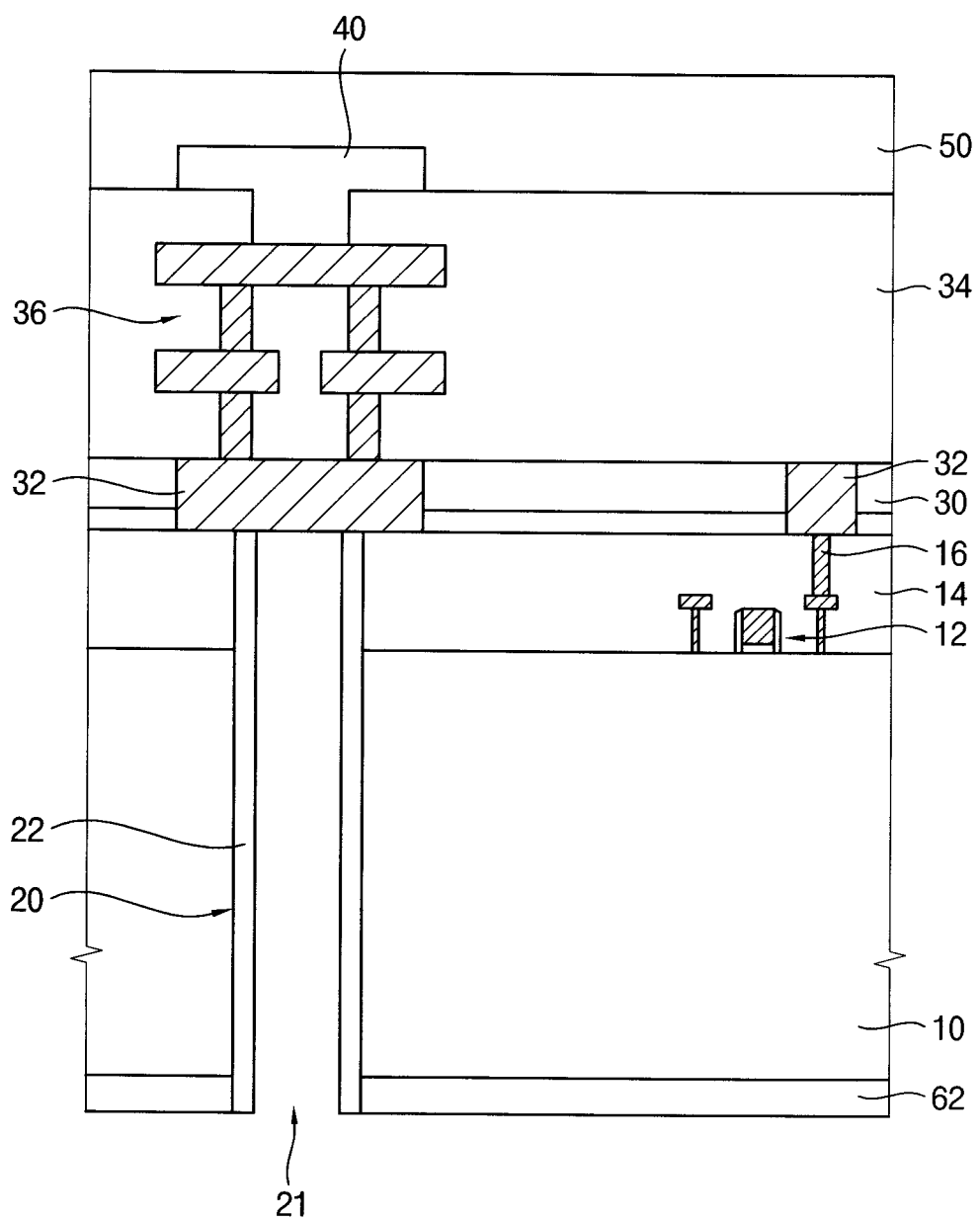

Referring to FIG. 11, the sacrificial layer pattern 26 may be removed to form a second opening 21 that defines a region for a through electrode to be formed.

The sacrificial layer pattern 26 may be removed by a wet etch process, a dry etch process, etc. Accordingly, only the sacrificial layer may be removed from the substrate 10 such that the first insulation layer 22 remains on the sidewalls of the first opening 22. The first upper wiring 32 may be exposed through the second opening 21.

Figure 12:
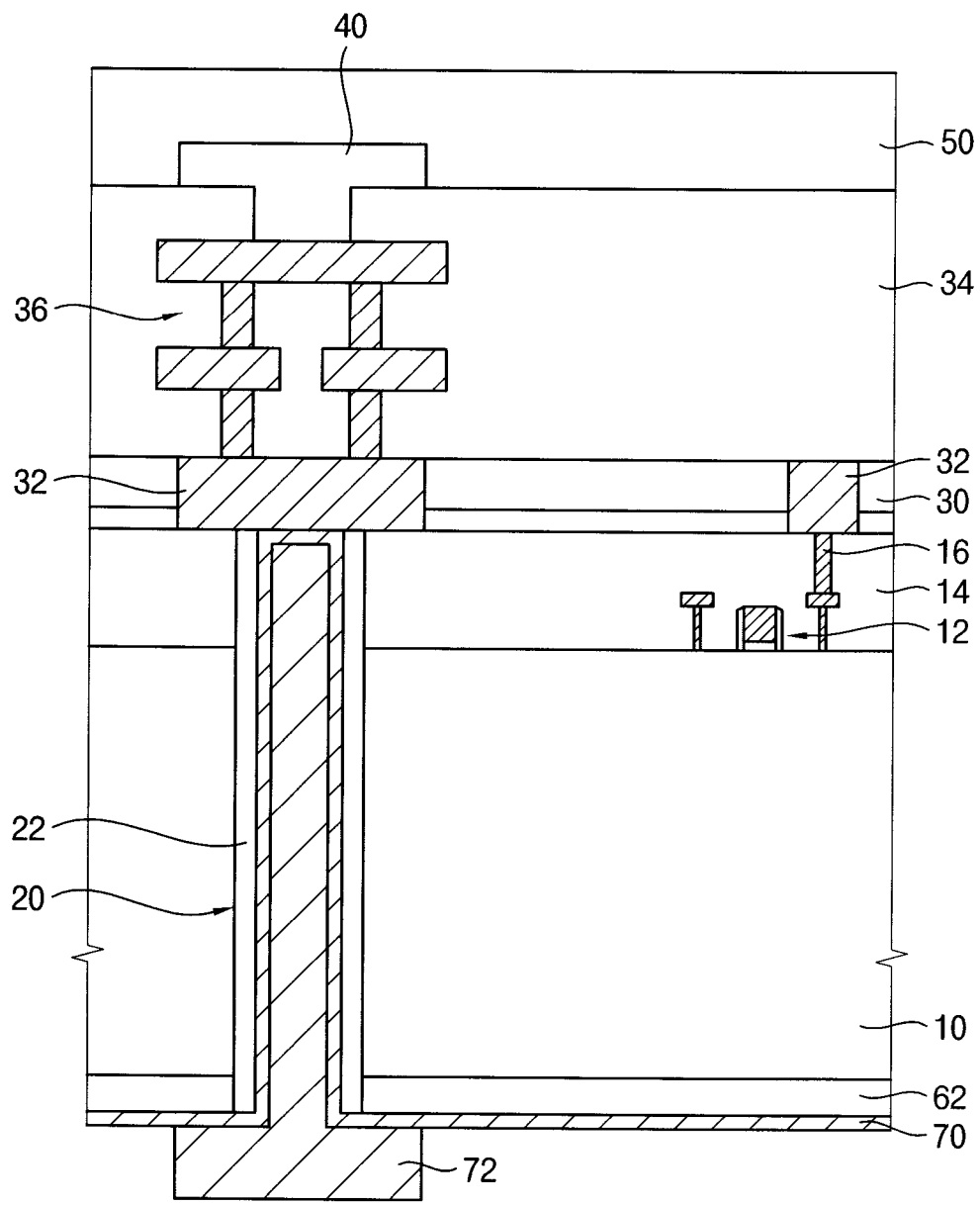

Referring to FIG. 12, a through electrode 72 may be formed in the second opening 21.

In example embodiments, a seed layer 70 may be formed conformally on sidewalls and a bottom surface of the second opening 21 and the second insulation layer pattern 62. The seed layer 70 may be used as an electrode during a plating process for forming a following conductive layer.

A conductive layer (not shown) may be formed on the seed layer 70 to fill the second opening 21. The conductive layer may be formed using a metal having a relatively low resistance. For example, the conductive layer may be formed by an electroplating process, an electroless plating process, etc. The conductive layer may include copper (Cu), aluminum (Al), gold (Au), titanium (Ti), tantalum (Ta), tungsten (W), etc. These may be used alone or in a combination thereof.

Then, the conductive layer may be patterned to form the through electrode 72 in the second opening 21 to be electrically connected to the first upper wiring 32. Alternatively, the through electrode may be formed by a chemical vapor deposition process.

In the present example embodiments, after a wafer process (FEOL process) is performed to form the circuit patterns 12 on the first surface of the substrate 10 and the sacrificial layer pattern 26 is formed in the substrate 10 to extend from the first surface of the substrate 10, a wiring process (BEOL process) may be performed to form the upper wiring layer 38 on the first surface (e.g., the upper surface) of the substrate 10. Then, after the sacrificial layer pattern 26 is removed from the second surface of the substrate 10 to form the opening 21, the through electrode 72 may be formed in the opening 21 to be electrically connected to the first upper wiring 32.

Accordingly, because the through electrode is formed in a region where the sacrificial layer pattern is removed from the substrate, a misalignment problem of the through electrode between the first upper wiring of the upper wiring layer 38 may not occur.

Additionally, because the through electrode 72 is formed after performing the wiring process (BEOL process), a thermal stress to the through electrode 72 under a high temperature (for example, 400° C.) of the BEOL process may be avoided. Accordingly, the through electrode 72 may be formed to have a desired depth without thermal stress.

Further, because the through electrode 72 is formed after performing a planarization process for a backside of the substrate, a conductive material of the through electrode 72 such as copper may be prevented from diffusing into the substrate during the manufacturing processes.

Figure 13:
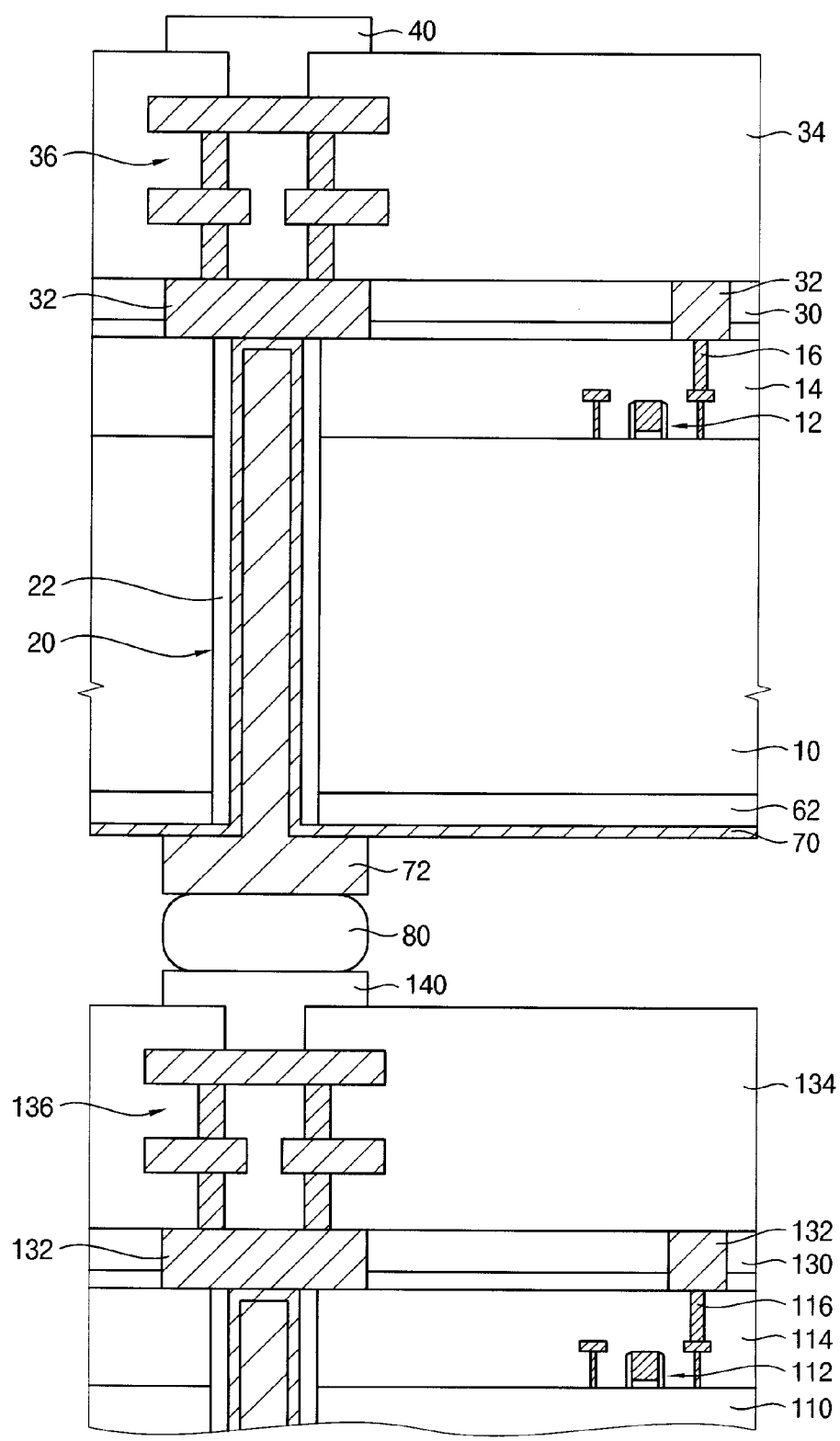
Figure 14:
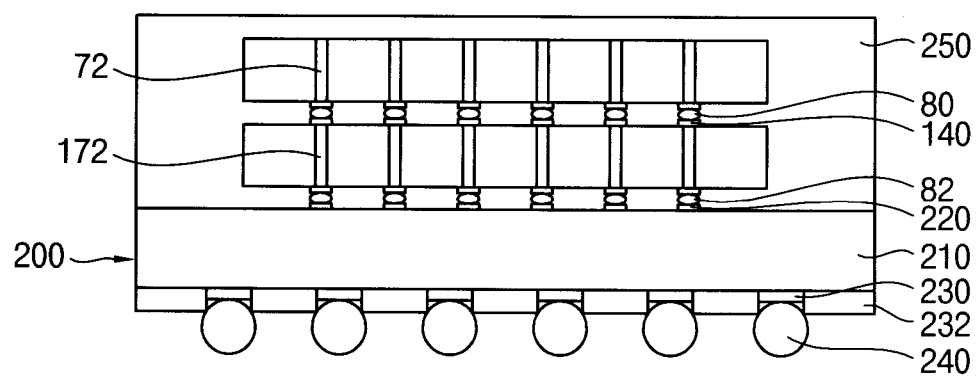

Referring to FIGS. 13 and 14, semiconductor devices formed by the above processes may be stacked using the through electrode. Hereinafter, the stacked semiconductor devices may be referred to as a first semiconductor chip and a second semiconductor chip.

For example, the first semiconductor chip may be stacked on the second semiconductor chip via a first bump 80. The first bump 80 may be disposed on a connection pad 140 of the second semiconductor chip and may be adhered to the through electrode 72 of the first semiconductor chip.

In particular, the first bump 80 may be adhered to the connection pad 140 of the second semiconductor chip by a reflow process such that the first semiconductor chip is stacked on the second semiconductor chip. Similarly, a second bump 82 may be adhered to a connection pad 220 of a mounting substrate 200 such that the second semiconductor chip is mounted on the mounting substrate 200 to form a stack package 300.

Thus, the through electrodes 72 and 172 may be adhered to a connection member (e.g., the bumps 80/82) to electrically connect the first semiconductor chip and the second semiconductor chip.

Then, a sealing member 250 may be formed on an upper surface of the mounting substrate 200 to protect the first and second semiconductor chips from outside. After solder balls 240 are disposed on a plurality of outer connection pads 230 on a lower surface of the mounting substrate 200, the stack package 300 may be mounted on a module substrate (not illustrated) to complete a memory module (not illustrated).

Figure 15:
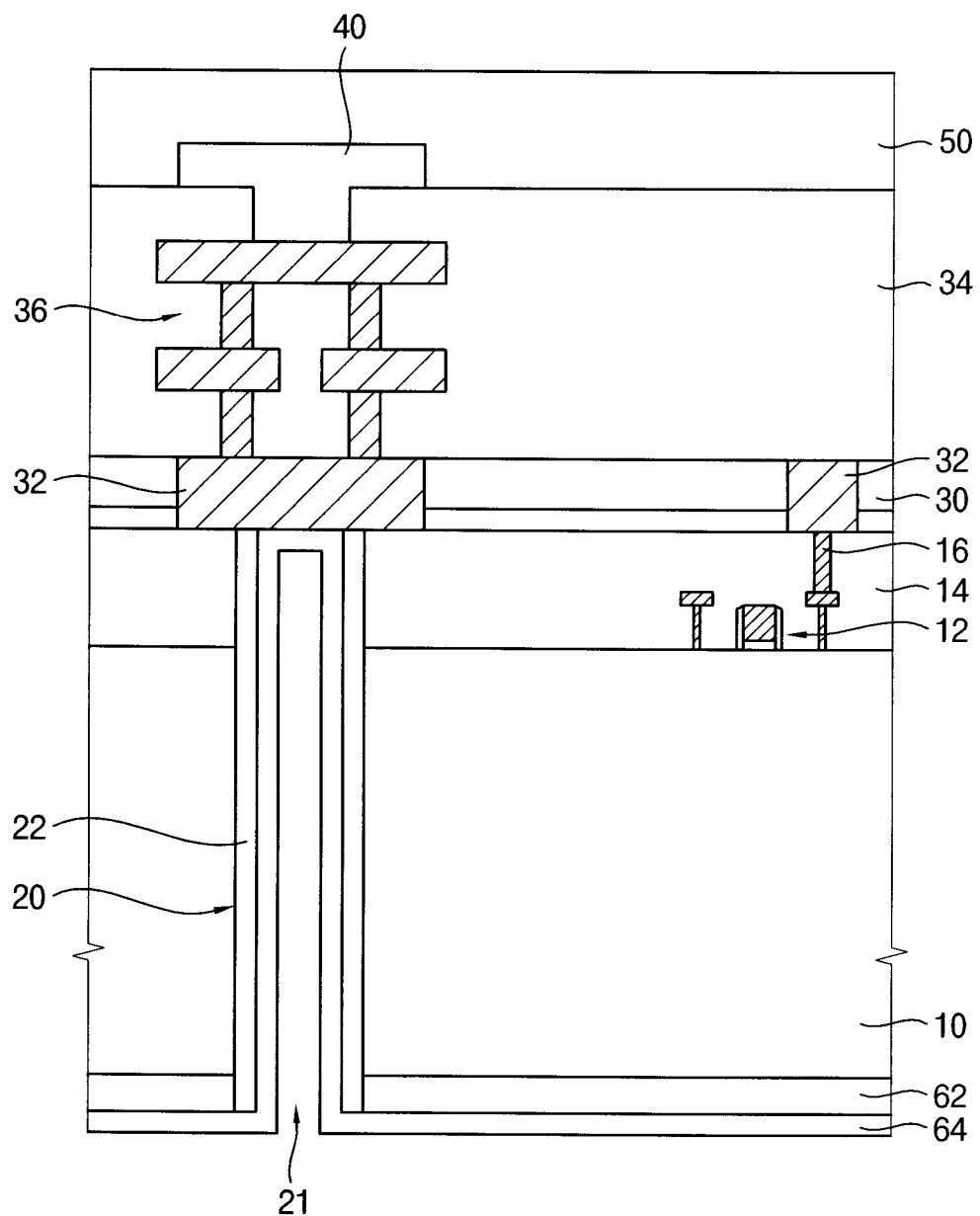
Figure 16:
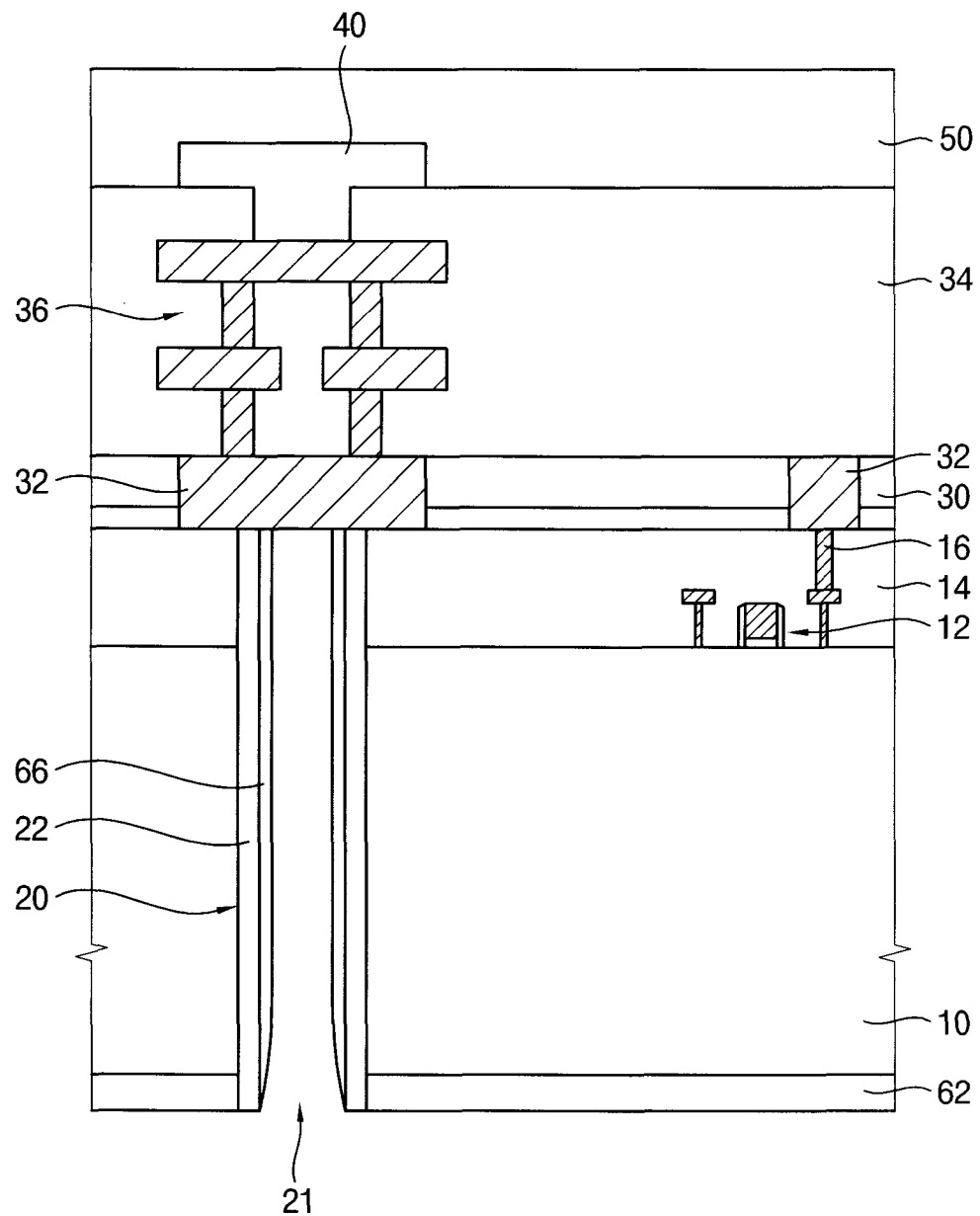
Figure 17:
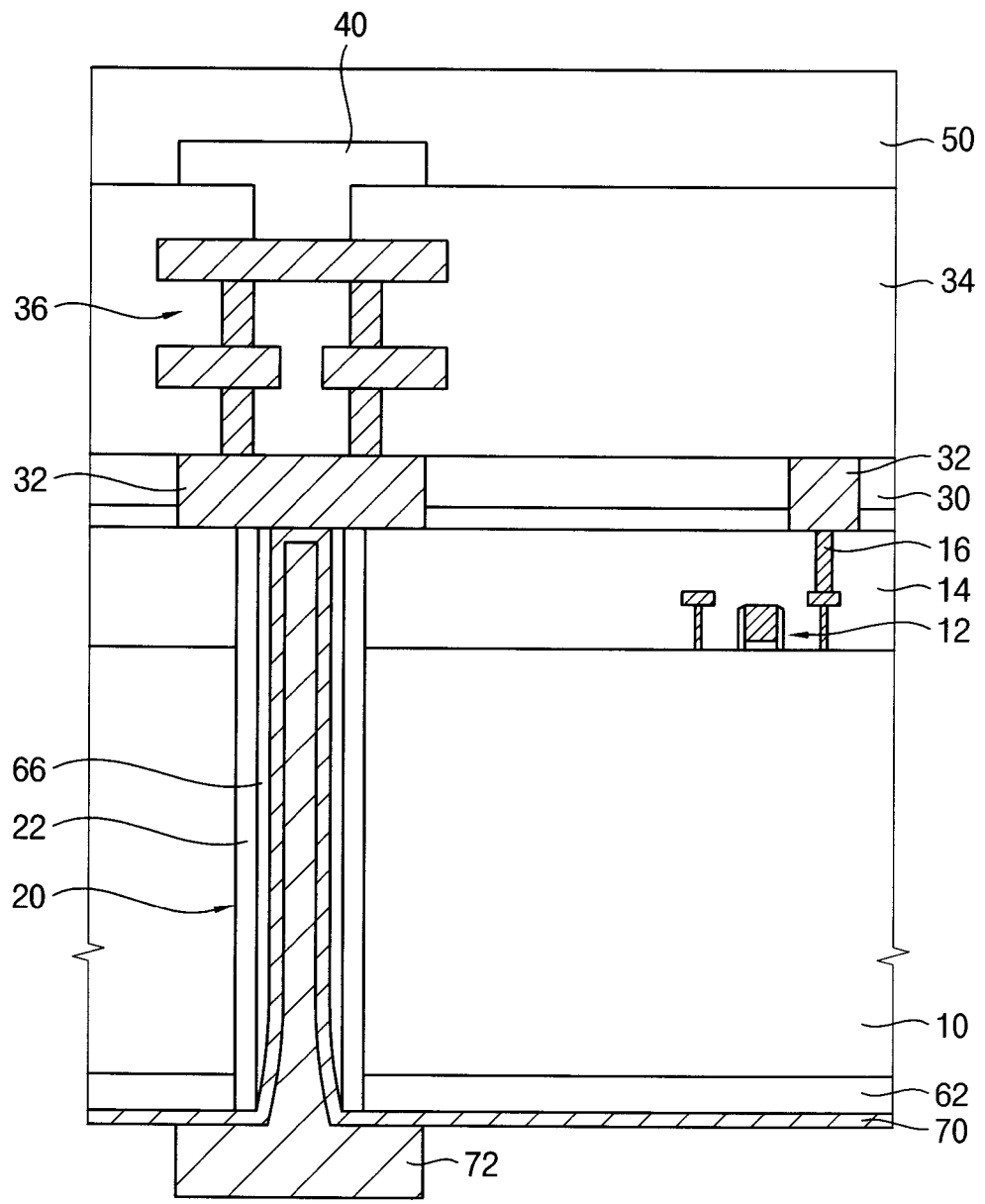

FIGS. 15 to 17 are cross-sectional views illustrating a method of manufacturing a semiconductor device in accordance with example embodiments. The present embodiments are substantially the same as in the embodiments of FIGS. 1 to 14 except processes of forming a through electrode. Thus, the same reference numerals will be used to refer to the same or like elements as those described in the embodiments of FIGS. 1 to 14 and any further repetitive explanation concerning the above elements will be omitted for the sake of brevity.

First, the processes that are illustrated with reference to FIGS. 1 to 11 may be performed to form the second opening 21 that extends from the second surface of the substrate 10 in a thickness direction of the substrate. The first upper wiring 32 may be exposed by a bottom surface of the second opening 21.

Referring to FIGS. 15 and 16, a third insulation layer 64 for forming a spacer may be formed conformally on sidewalls and a bottom surface of the second opening 21 and an upper surface of the second insulation layer pattern 62. The third insulation layer 64 may be formed using an insulating material having excellent step coverage. For example, the third insulation layer may be formed using silicon oxide or silicon nitride. Then, the third insulation layer 64 may be anisotropically etched to form a spacer 66 on the sidewalls of the second opening 21.

Referring to FIG. 17, a through electrode 72 may be formed on the spacer 66 in the second opening 21.

For example, a seed layer 70 may be formed conformally on the bottom surface of the second opening 21, the spacer 66 and the second insulation layer pattern 62. A conductive layer (not shown) may be formed on the seed layer 70 to fill the second opening 21. The conductive layer may be formed using a metal having a relatively low resistance. For example, the conductive layer may be formed by an electroplating process, an electroless plating process, etc. The conductive layer may include copper (Cu), aluminum (Al), gold (Au), indium (In), nickel (Ni), etc. These may be used alone or in a combination thereof. Then, the conductive layer may be patterned to form the through electrode 72 in the second opening 21 to be electrically connected to the first upper wiring 32.

In the present example embodiments, after the sacrificial layer pattern 26 is removed to form the second opening 21, the spacer 66 may be formed on the sidewalls of the second opening 21. The through electrode 72 may be formed on the spacer 66 in the second opening 21 to be electrically connected to the first upper wiring 32.

The second opening 21 may be formed by removing the sacrificial layer pattern 26. Accordingly, the spacer 66 may be formed on the sidewalls of the second opening 21, to thereby improve the profile of the second opening 21.

Figure 18:
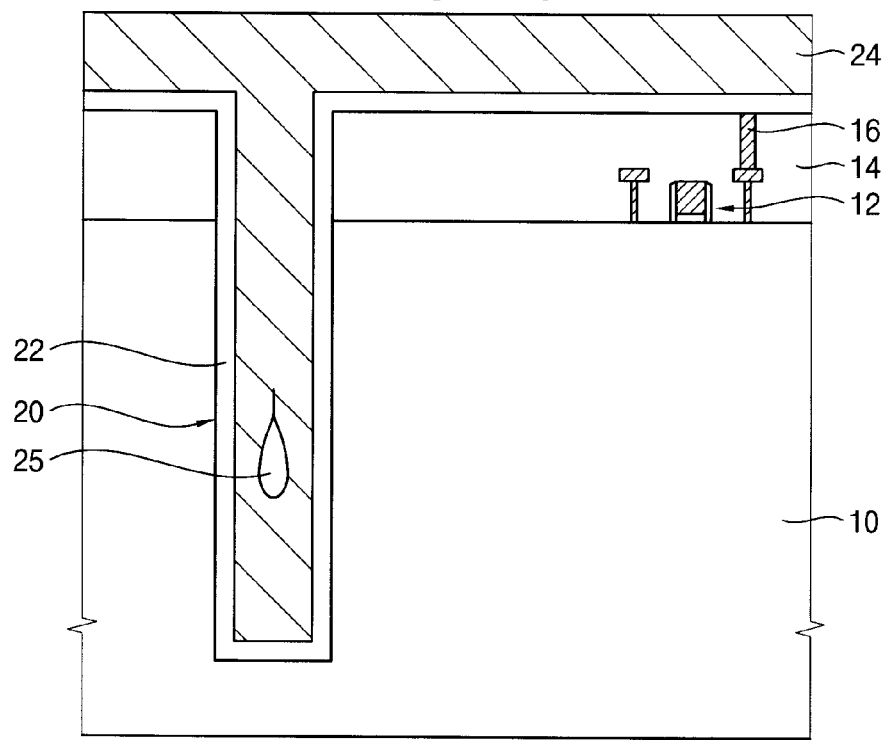
Figure 19:
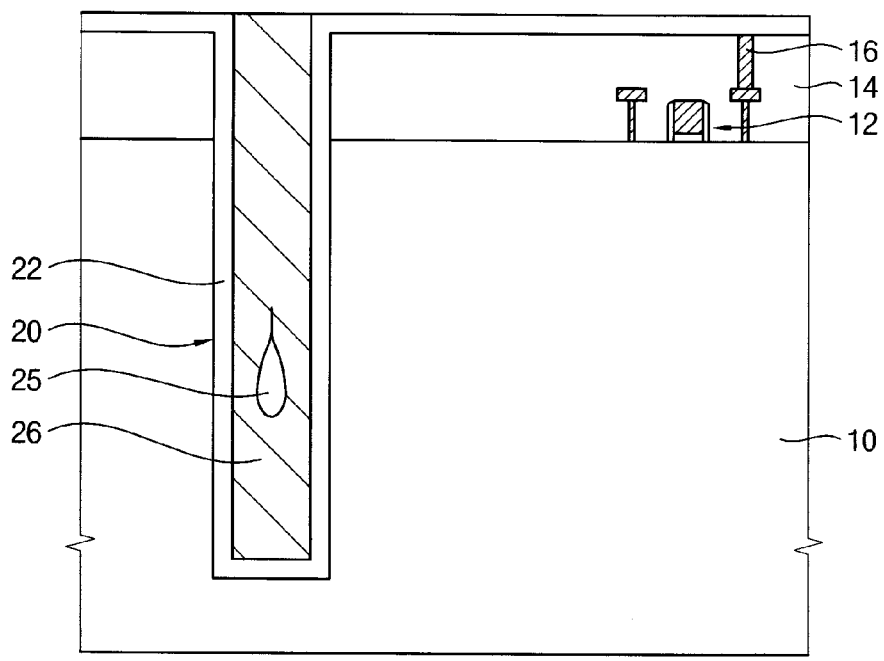

FIGS. 18 and 19 are cross-sectional views illustrating a method of manufacturing a semiconductor device in accordance with example embodiments. The present embodiments are substantially the same as in the embodiments of FIGS. 1 to 14 except processes of forming a sacrificial layer pattern. Thus, the same reference numerals will be used to refer to the same or like elements as those described in the embodiments of FIGS. 1 to 14 and any further repetitive explanation concerning the above elements will be omitted for the sake of brevity.

First, the processes that are illustrated with reference to FIGS. 1 and 2 may be performed to form the first opening 20 that extends from the first surface of the substrate 10 in a thickness direction of the substrate.

Referring to FIGS. 18 and 19, a sacrificial layer pattern 26 may be formed in the first opening 20.

A first insulation layer 22 may be formed on sidewalls and a bottom surface of the first opening 20, and on an upper surface and sidewalls of the insulation interlayer 14. A sacrificial layer 24 may be formed on the first insulation layer 22 to fill the first opening 20. The sacrificial layer 24 may be formed using an insulating material having an etch selectivity with respect to the first insulation layer 22.

In the present example embodiments, the sacrificial layer 24 may be formed to have a void 25. Accordingly, the sacrificial layer 24 may be formed to partially fill the first opening 20.

Then, an upper portion of the sacrificial layer 24 may be removed to form the sacrificial layer pattern 26 having the void 25 in the first opening 20. For example, the sacrificial layer 24 may be removed by a chemical mechanical polishing process, an etch process, etc.

Then, processes the same as or similar to those that are illustrated with reference to FIGS. 5 to 14 may be performed to form a semiconductor device.

In the present example embodiments, after the sacrificial layer pattern 26 having the void 25 is formed, a wiring process (BEOL process) may be performed to form an upper wiring layer on the surface of the substrate 10.

Accordingly, although the wiring process may be performed under a relatively high temperature, the void 25 of the sacrificial layer pattern 26 may reduce or compensate for thermal stress under a high temperature during the wiring process.

FIGS. 20 to 23 are cross-sectional views illustrating a method of manufacturing a semiconductor device in accordance with example embodiments. The present embodiments are substantially the same as in the embodiments of FIGS. 1 to 14 except processes of forming an addition capping layer before an upper wiring layer is formed. Thus, the same reference numerals will be used to refer to the same or like elements as those described in the embodiments of FIGS. 1 to 14 and any further repetitive explanation concerning the above elements will be omitted for the sake of brevity.

First, the processes that are illustrated with reference to FIGS. 1 to 4 may be performed to form the sacrificial layer pattern 26 in a region that a through electrode will be formed. The sacrificial layer pattern 26 may extend from the first surface of the substrate 10 in a thickness direction of the substrate 10.

Figure 20:
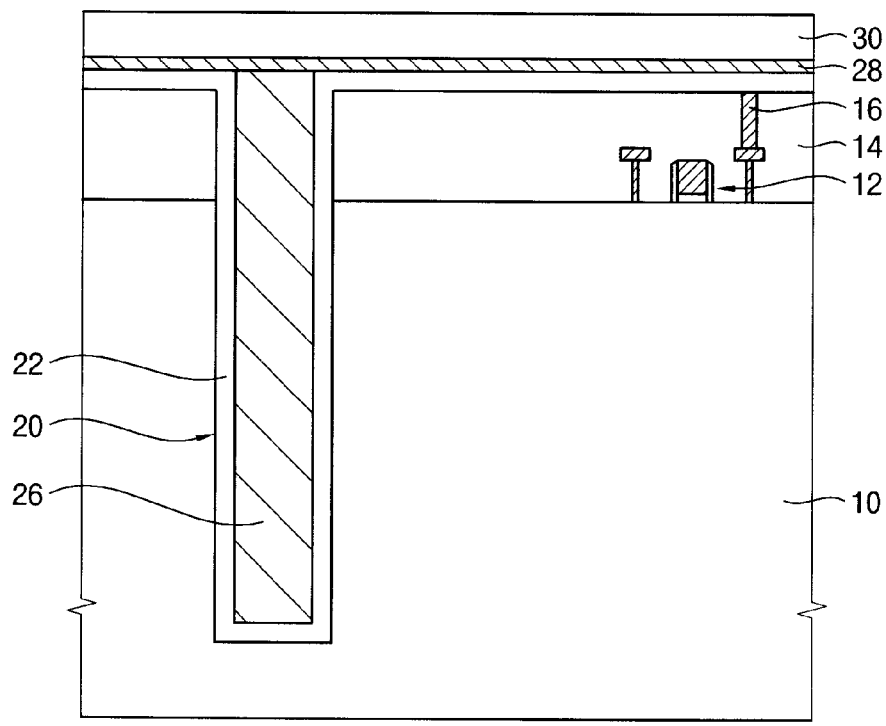

Referring to FIG. 20, a capping layer 28 may be formed on the sacrificial layer pattern 26. For example, the capping layer 28 may be formed using silicon oxide or silicon nitride.

Figure 21:
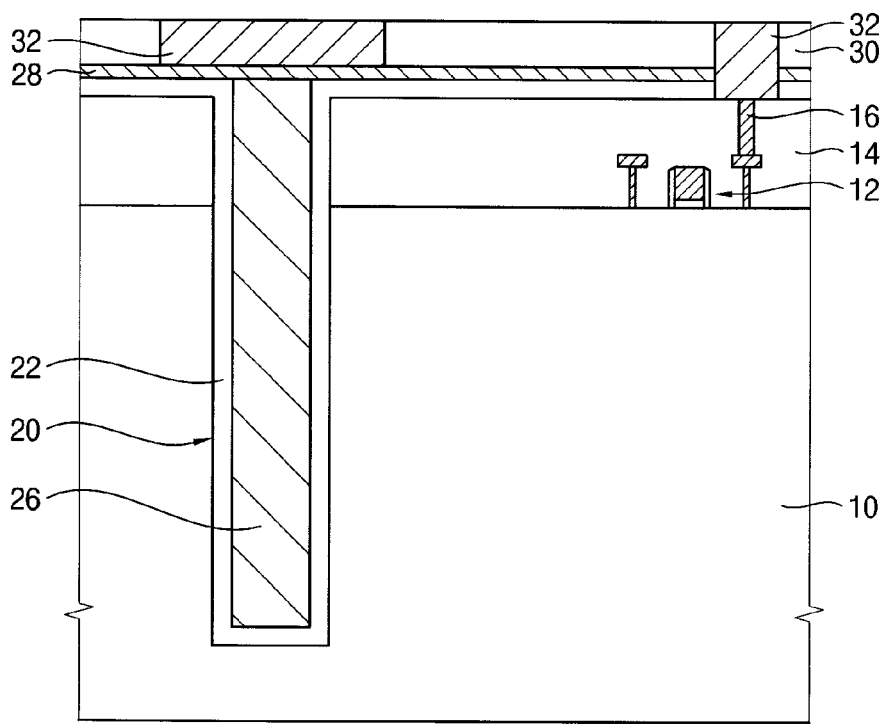
Figure 23:
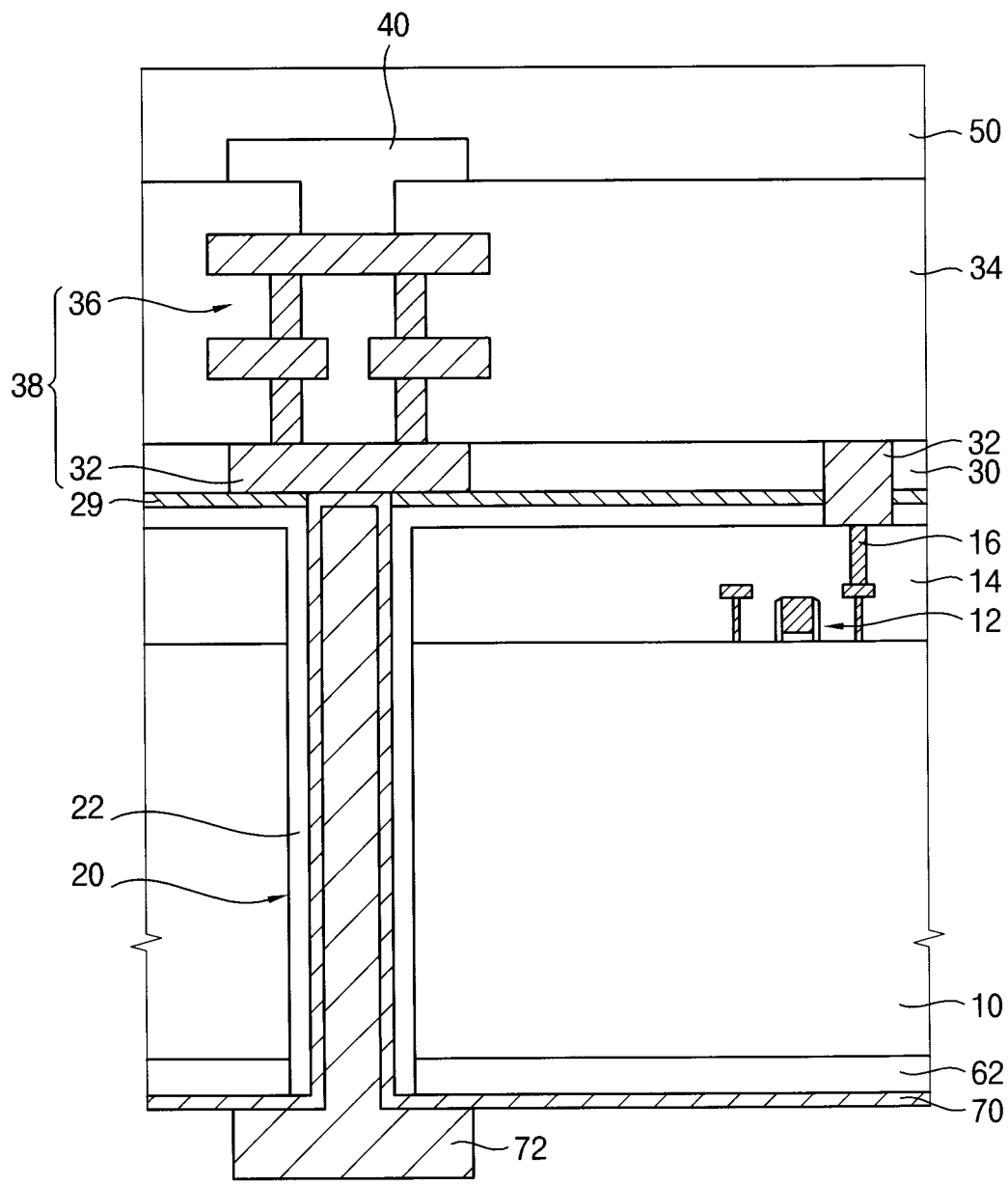

Referring to FIGS. 21 and 23, an upper wiring layer 38 may be formed on the capping layer 28.

In particular, after a first inter-metal dielectric layer 30 is formed on the capping layer 28, first upper wirings 32 may be formed in (e.g., extending through), or on, the capping layer 28. The first upper wirings 32 may be formed in the first inter-metal dielectric layer 30. Accordingly, the capping layer 28 may be interposed between the first upper wiring 32 and the sacrificial layer pattern 26.

Then, a second inter-metal dielectric layer 34 may be formed on the first inter-metal dielectric layer 30. Second upper wirings 36 may be formed in the second inter-metal dielectric layer 34.

Figure 22:
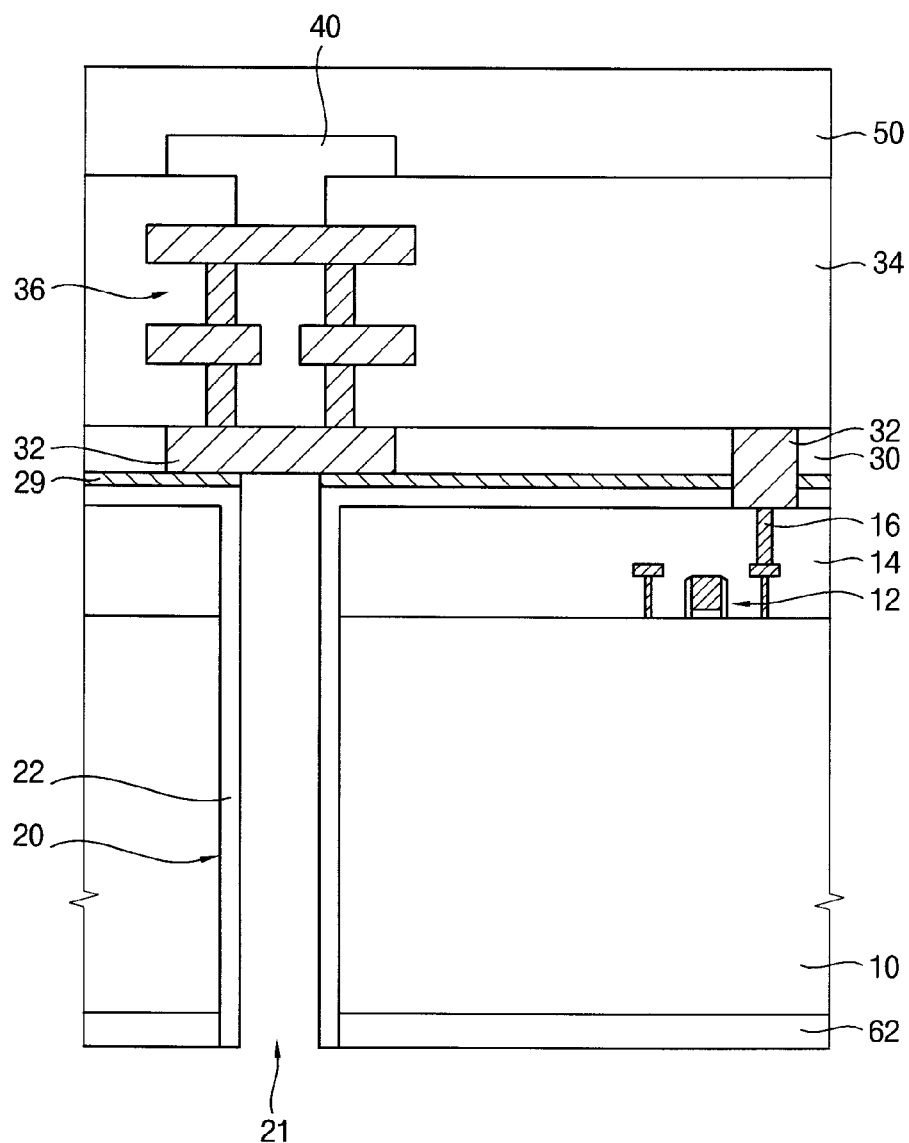

Referring to FIG. 22, processes the same as or similar to those that are illustrated with reference to FIGS. 8 to 11 may be performed to remove the sacrificial layer pattern 26 from the substrate 10. In this case, the capping layer 28 may be partially removed together with the sacrificial layer pattern 26 to form a capping layer pattern 29 that exposes the first upper wiring 32 through the bottom surface of the second opening 21.

Referring to FIG. 23, a through electrode 72 may be formed in the second opening 21. Accordingly, the through electrode 72 may be electrically connected to the first upper wiring 32 that is exposed by the capping layer pattern 29.

In the present example embodiments, after the capping layer 28 is formed, the upper wiring layer 38 is formed. Then, the capping layer 28 may be partially removed together with the sacrificial layer pattern 26 to form the second opening 21 that exposes the first upper wiring 32.

Accordingly, the capping layer 28 may be used for end point detection in an etch process for removing the sacrificial layer pattern 26, to thereby improve the profile of the second opening 21.

Figure 24:
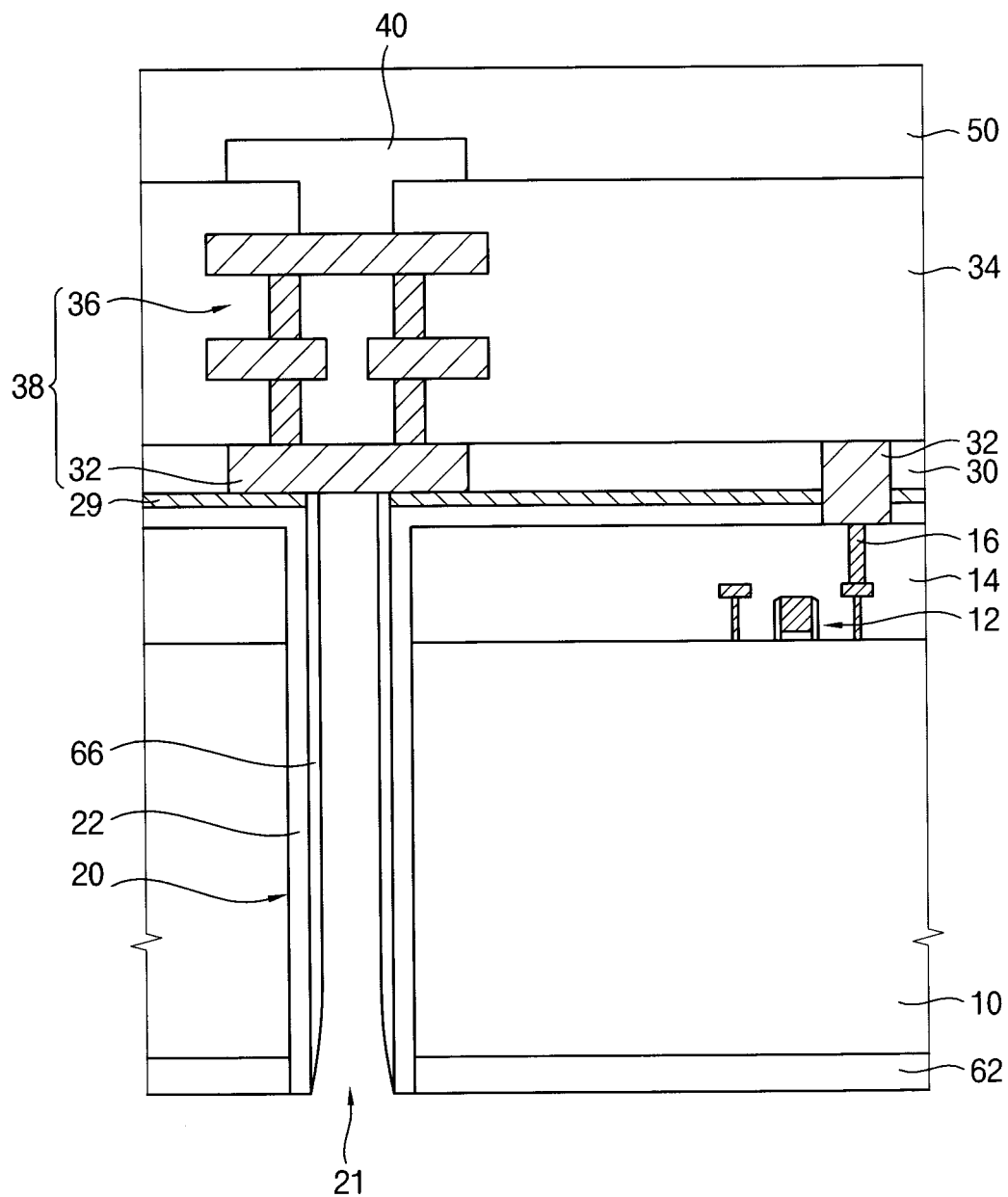
Figure 25:
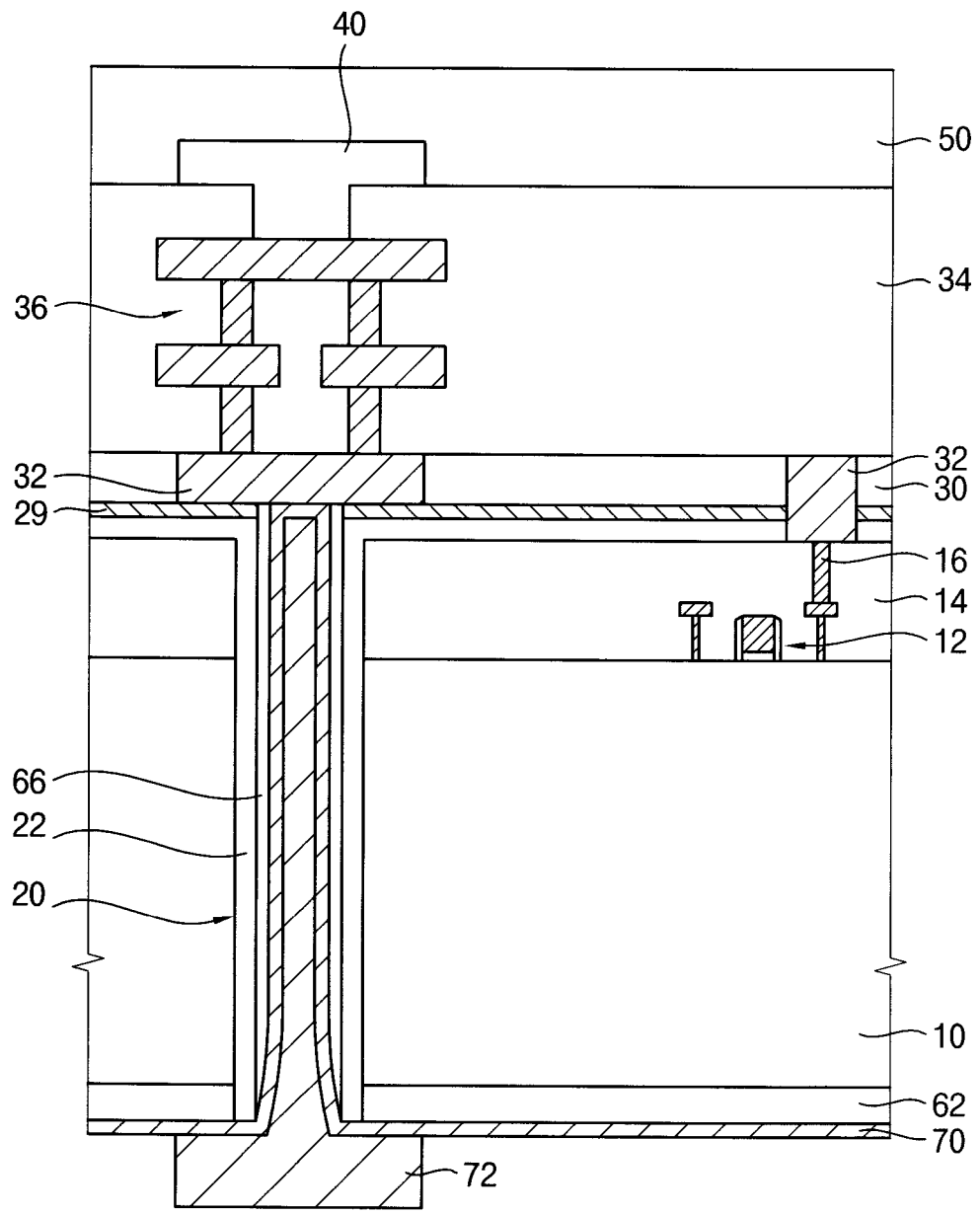

FIGS. 24 and 25 are cross-sectional views illustrating a method of manufacturing a semiconductor device in accordance with example embodiments. The present embodiments are substantially as in FIGS. 20 to 23 except processes of forming a through electrode. Thus, the same reference numerals will be used to refer to the same or like elements as those described in FIGS. 20 to 23 and any further repetitive explanation concerning the above elements will be omitted.

First, the processes that are illustrated with reference to FIGS. 20 to 22 may be performed such that the sacrificial layer pattern 26 and a portion of the capping layer 28 are removed to form the capping layer pattern 29 that exposes the first upper wiring 32 through the bottom surface of the second opening 21.

Referring to FIG. 24, a spacer 66 may be formed on sidewalls of the second opening 21.

In particular, a third insulation layer (not shown) for forming a spacer may be formed conformally on sidewalls and a bottom surface of the second opening 21 and an upper surface of the second insulation layer pattern 62. The third insulation layer may be anisotropically etched to form a spacer 66 on the sidewalls of the second opening 21.

Referring to FIG. 25, a through electrode 72 may be formed on the spacer 66 in the second opening 21.

For example, a seed layer 70 may be formed conformally on the bottom surface of the second opening 21, the spacer 66 and the second insulation layer pattern 62. A conductive layer (not shown) may be formed on the seed layer 70 to fill the second opening 21. The conductive layer may be formed using a metal having a relatively low resistance. Then, the conductive layer may be patterned to form the through electrode 72 in the second opening 21 to be electrically connected to the first upper wiring 32.

In the present example embodiments, after the capping layer 28 is formed, the upper wiring layer 38 may be formed. The capping layer 28 may be partially removed together with the sacrificial layer pattern 26 to form the second opening 21 that exposes the first upper wiring 32. Further, after the second opening 21 is formed, the spacer 66 may be formed on the sidewalls of the second opening 21. The through electrode 72 may be formed on the spacer 66 in the second opening 21 to be electrically connected to the first upper wiring 32.

Accordingly, the capping layer 28 may be used for end point detection in an etch process for removing the sacrificial layer pattern 26 and the spacer 66 may be formed on the sidewalls of the second opening 21, to thereby improve the profile of the second opening 21.

Figure 26:
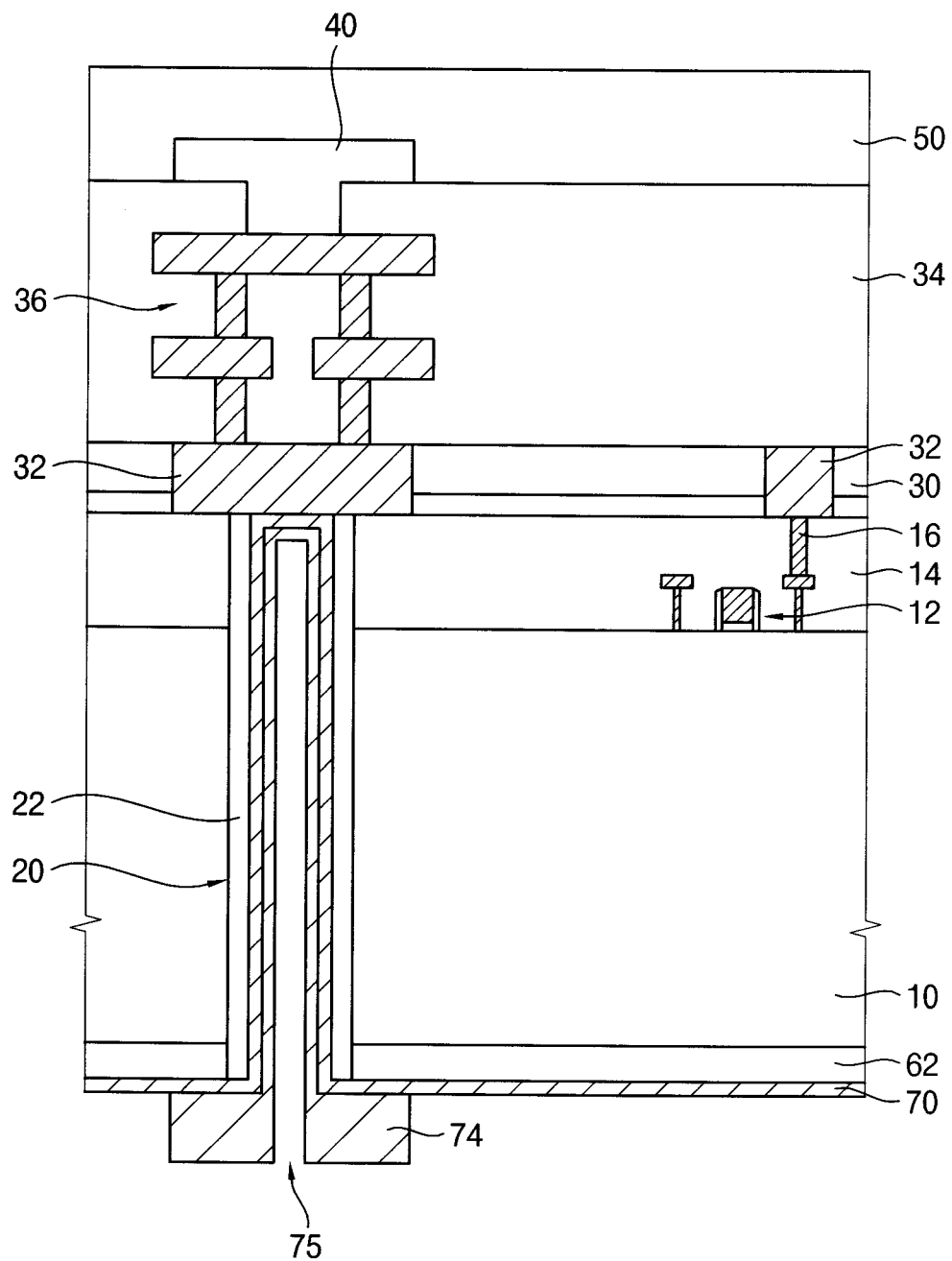

FIG. 26 is a cross-sectional view illustrating a method of manufacturing a semiconductor device in accordance with example embodiments. The present embodiments are substantially the same as in the embodiments of FIGS. 1 to 14 except processes of forming a through electrode. Thus, the same reference numerals will be used to refer to the same or like elements as those described in the embodiments of FIGS. 1 to 14 and any further repetitive explanation concerning the above elements will be omitted for the sake of brevity.

First, the processes that are illustrated with reference to FIGS. 1 to 11 may be performed such that the sacrificial layer pattern 26 is removed from the substrate 10 to form the second opening 21 that defines a region for a through electrode to be formed.

Referring to FIG. 26, a through electrode 74 having a recess 75 may be formed in the opening 21.

For example, a seed layer 70 may be formed in the second opening 21 and a conductive layer (not shown) may be formed on the seed layer 70 to partially fill the second opening 21. Then, the conductive layer may be patterned to form the through electrode 74 in the second opening 21 that are electrically connected to the first upper wiring 32.

In the present example embodiments, the through electrode 74 may have the recess in an upper portion thereof. The through electrode 74 may have a ring shaped cross section. A buried pattern (not illustrated) may be formed on the through electrode 74 to fill the recess. The buried pattern may include an insulating material or a conductive material. For example, the buried pattern may include a spin-on glass (SOG) oxide, a flowable Si, titanium, aluminum, a porous material, etc. The through electrode 74 may have a cup shape. The through electrode 74 may serve a contact plug for an electrical signal path.

Figure 27:
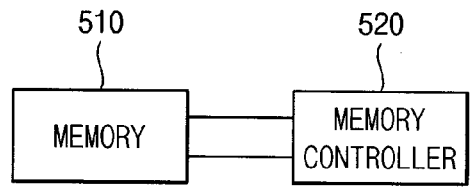

FIG. 27 illustrates other example embodiments.

As illustrated in FIG. 27, these example embodiments includes a memory 510 connected to a memory controller 520. The memory 510 may include the memory device discussed above. The memory controller 520 supplies input signals for controlling operation of the memory.

Figure 28:
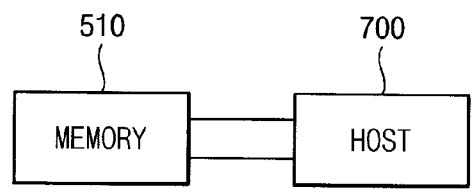

FIG. 28 illustrates yet other example embodiments.

Referring to FIG. 28, these example embodiments include a memory connected with a host system 700. The memory 510 may include the memory device discussed above.

The host system 700 may include an electric produce such as a personal computer, digital camera, mobile application, game machine, communication equipment, etc. The host system 700 supplies the input signals for controlling operation of the memory 510. The memory 510 is used as a data storage medium.

Figure 29:
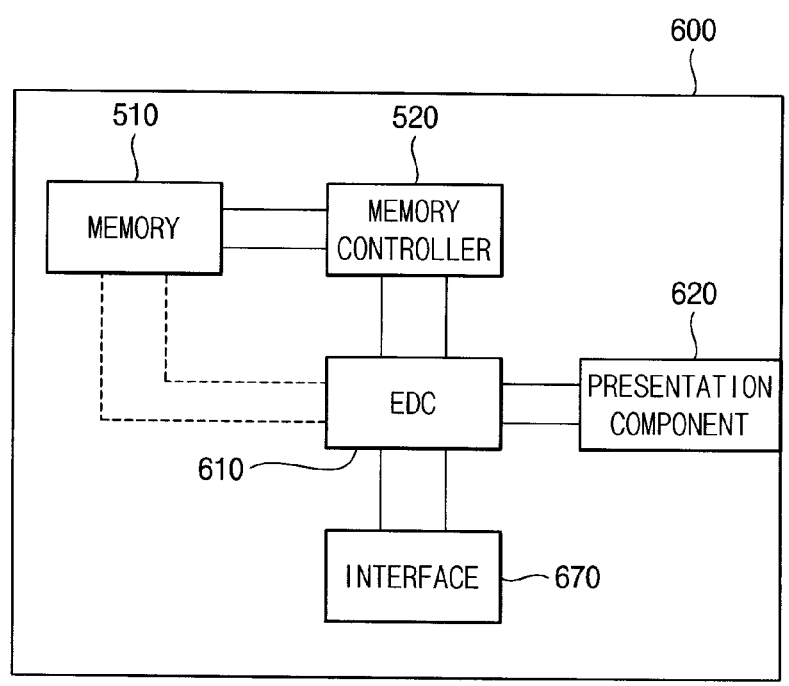

FIG. 29 illustrates further example embodiments. These example embodiments represent a portable device 600. The portable device 600 may be an MP3 player, video player, combination video and audio player, etc. As illustrated, the portable device 600 may include the memory 510 and memory controller 520. The memory may include the memory device discussed above. The portable device 600 may also include an encoder/decoder EDC 610, a presentation component 620 and an interface 670. Data (video, audio, etc.) is inputted/outputted to/from the memory 510 via the memory controller 520 by the EDC 610.

As mentioned above, in a method of manufacturing a semiconductor device in accordance with example embodiments, a sacrificial layer pattern may be formed in a region that a through electrode will be formed to extend from a first surface of a substrate in a thickness direction of the substrate. A wiring process (BEOL) process may be performed to form an upper wiring layer on the first surface including wirings that are electrically connected the through electrode. Then, after the sacrificial layer pattern is removed from a second surface of the substrate to form an opening, the through electrode may be formed in the opening to be electrically connected to the wiring.

Accordingly, because the through electrode is formed in a region where the sacrificial layer pattern is removed from the substrate, a misalignment problem of the through electrode between the first upper wiring of the upper wiring layer may not occur. Additionally, because the through electrode is formed after performing the wiring process (BEOL process), thermal stress to the through electrode under a high temperature of the BEOL process may be avoided. Further, because the through electrode is formed after performing a planarization process for a backside of the substrate, a conductive material of the through electrode such as copper may be prevented from diffusing into the substrate during the manufacturing processes.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, comprising:
    preparing a substrate having a first surface and a second surface opposite to the first surface;
    forming a sacrificial layer pattern in a region of the substrate that a through electrode will be formed, the sacrificial layer pattern extending from the first surface of the substrate in a thickness direction of the substrate;
    forming an upper wiring layer on the first surface of the substrate, the upper wiring layer including a wiring on the sacrificial layer pattern;
    partially removing the second surface of the substrate to expose the sacrificial layer pattern;
    removing the sacrificial layer pattern from the second surface of the substrate to form a first opening that exposes the wiring; and
    forming a through electrode in the first opening to be electrically connected to the wiring.

2. The method of claim 1, wherein forming the sacrificial layer pattern includes,
    forming a second opening in the substrate, the second opening extending from the first surface in a thickness direction of the substrate;
    forming a first insulation layer on sidewalls and a bottom surface of the second opening;
    forming a sacrificial layer on the first insulation layer; and
    partially removing the sacrificial layer to form the sacrificial layer pattern that partially fills the second opening.

3. The method of claim 2, wherein the sacrificial layer is formed using an insulating material having an etch selectivity with respect to the first insulation layer.

4. The method of claim 3, wherein the sacrificial layer has an etch rate at least three times greater than that of the first insulation layer.

5. The method of claim 3, wherein an etch selectivity of the sacrificial layer and the first insulation layer ranges from about 3:1 to about 20:1.

6. The method of claim 2, wherein forming the sacrificial layer pattern includes partially removing the sacrificial layer by a chemical mechanical polishing process or an etch process.

7. The method of claim 1, further comprising forming a spacer on sidewalls of the first opening after forming the first opening that exposes the wiring.

8. The method of claim 1, wherein the sacrificial layer pattern has a void formed therein.

9. The method of claim 1, further comprising forming a capping layer on the sacrificial layer pattern.

10. The method of claim 9, wherein forming the first opening that exposes the wiring includes partially removing the capping layer when the sacrificial layer pattern is removed from the substrate.

11. The method of claim 1, wherein the through electrode is formed conformally along a profile of the first opening to partially fill the first opening.

12. The method of claim 11, wherein the through electrode includes a recess in an upper portion thereof.

13. The method of claim 1, wherein partially removing the second surface of the substrate to expose the sacrificial layer pattern includes,
   partially removing the second surface of the substrate to expose a portion of the sacrificial layer pattern;
   forming a second insulation layer on the second surface of the substrate to cover the exposed sacrificial layer pattern; and
   partially removing the second insulation layer to form a second insulation layer pattern that exposes a lower portion of the sacrificial layer pattern.

14. A method of manufacturing a semiconductor device, comprising:
   providing a substrate having a first recess;
   forming a sacrificial layer pattern on a first surface of the substrate, the sacrificial layer pattern filling in the first recess;
   forming an upper wiring layer on the first surface of the substrate;
   exposing the sacrificial layer pattern by partially removing a second surface of the substrate, the second surface opposing the first surface of the substrate;
   exposing the upper wiring layer by removing the exposed sacrificial layer pattern from the first recess; and
   forming a through electrode connected to the exposed upper wiring layer, wherein the through electrode is electrically connected to a wiring in the exposed upper wiring layer.

15. The method of claim 14, further comprising:
   forming an insulation layer conformally on sidewalls of the first recess, after exposing the wiring; and
   etching the insulation layer to form a spacer on the sidewalls of the first recess; and
   forming a seed layer on the spacer, the through electrode being formed on the seed layer.

16. The method of claim 14, wherein forming the sacrificial layer pattern on the first surface of the substrate includes partially filling the first recess with an insulating material used to form the sacrificial layer pattern.

17. The method of claim 16, wherein the sacrificial layer pattern has a void.

18. The method of claim 14, further comprising:
   forming a capping layer on the sacrificial layer pattern, prior to forming the upper wiring layer,
   wherein exposing the upper wiring layer includes partially removing the capping layer.

19. The method of claim 18, further comprising:
   forming an insulation layer conformally on sidewalls of the first recess and the capping layer, after exposing the upper wiring layer; and
   etching the insulation layer to form a spacer on the sidewalls of the first recess; and
   forming a seed layer on the spacer, the through electrode being formed on the seed layer.

20. The method of claim 19, further comprising forming a second recess in the through electrode.

* * * * *